United States Patent [19]

Shincovich et al.

[11] Patent Number: 5,590,179
[45] Date of Patent: Dec. 31, 1996

[54] REMOTE AUTOMATIC METER READING APPARATUS

[75] Inventors: John T. Shincovich, North Canton; Jan K. Michalek; Norman C. Baldwin, both of Newark; Ebrahim Shahrodi, Delaware, all of Ohio; Darrell Robinson, Highland, Mich.; Allen V. Pruehs, Howell, Mich.; Robert O. Learmont, Walled Lake, Mich.

[73] Assignee: Ekstrom Industries, Inc., Farmington Hills, Mich.

[21] Appl. No.: 400,495

[22] Filed: Mar. 8, 1995

Related U.S. Application Data

[63] Continuation of Ser. No. 17,650, Feb. 12, 1993, abandoned.

[51] Int. Cl.[6] .................................................. H04M 11/00
[52] U.S. Cl. ...................................... 379/107; 340/870.03
[58] Field of Search ................................. 379/106, 107, 379/102, 104, 105; 340/870.01, 870.03, 870.29, 870.02; 307/66; 361/663–665; 439/135, 517; 324/74

[56] References Cited

U.S. PATENT DOCUMENTS

| | | |
|---|---|---|
| 3,553,376 | 1/1971 | Bogaart . |
| 3,588,357 | 6/1971 | Sellari, Jr. . |
| 3,714,516 | 1/1973 | Howe .................................... 361/663 |
| 3,742,142 | 6/1973 | Martin . |
| 3,922,492 | 11/1975 | Lumsden . |
| 3,937,890 | 2/1976 | Blethen et al. . |
| 3,962,545 | 6/1976 | Abe . |
| 4,004,097 | 1/1977 | Spaulding . |
| 4,022,977 | 5/1977 | Nomura . |
| 4,063,661 | 12/1977 | Doby ....................................... 361/665 |
| 4,077,061 | 2/1978 | Johnston et al. . |
| 4,086,434 | 4/1978 | Bocchi . |
| 4,121,147 | 10/1978 | Becker et al. .......................... 361/664 |
| 4,124,835 | 11/1978 | Cahill, Jr. . |
| 4,241,237 | 12/1980 | Paraskevakos et al. . |
| 4,298,839 | 11/1981 | Johnston ............................. 340/870.02 |
| 4,314,738 | 2/1982 | Davis et al. ........................... 439/517 |
| 4,368,943 | 1/1983 | Davis et al. ........................... 439/517 |
| 4,388,611 | 6/1983 | Haferd . |
| 4,394,540 | 7/1983 | Willis et al. . |
| 4,455,483 | 6/1984 | Schönhuber . |
| 4,467,434 | 8/1984 | Hurley ................................. 340/870.02 |
| 4,504,831 | 3/1985 | Jahr et al. . |
| 4,540,849 | 9/1985 | Oliver . |
| 4,571,691 | 2/1986 | Kennon .............................. 340/870.02 |
| 4,578,536 | 3/1986 | Oliver et al. . |
| 4,584,527 | 4/1986 | Amigo ................................ 340/870.02 |
| 4,638,314 | 1/1987 | Keller . |
| 4,642,634 | 2/1987 | Gerri et al. . |
| 4,642,635 | 2/1987 | Snaper . |
| 4,646,003 | 2/1987 | Phillips et al. ........................... 324/74 |
| 4,646,084 | 2/1987 | Burrowes et al. . |
| 4,654,868 | 3/1987 | Shelley . |
| 4,674,113 | 6/1987 | Brennan, Jr. et al. . |
| 4,682,169 | 7/1987 | Swanson ................................ 379/107 |
| 4,688,038 | 8/1987 | Giammarese . |
| 4,689,801 | 8/1987 | Nurczyk et al. . |
| 4,707,852 | 11/1987 | Jahr et al. . |
| 4,710,919 | 12/1987 | Oliver et al. . |

(List continued on next page.)

*Primary Examiner*—Wing F. Chan
*Attorney, Agent, or Firm*—Graham & James LLP

[57] ABSTRACT

Instantaneous current and voltage values are digitized at each of a plurality of electrical utility customer sites and integrated by a processor to calculate electrical power consumed at each customer site. A communication interface couples the processor at each customer site to a central processor in a central utility site to communicate the power consumed values of each customer site to the central utility site. In a preferred embodiment, the automatic meter reader apparatus is mounted in an electrical watthour meter socket adapter which plugs into a watthour meter socket at each customer site. Telephone modem circuitry mounted in the socket adapter connects to telephone lines to communicate calculated power values from each customer site to the central utility site.

12 Claims, 17 Drawing Sheets

U.S. PATENT DOCUMENTS

| | | |
|---|---|---|
| 4,720,851 | 1/1988 | Smith . |
| 4,764,952 | 8/1988 | Feliu . |
| 4,772,213 | 9/1988 | Bell et al. ................................. 439/135 |
| 4,792,677 | 12/1988 | Edwards et al. .................... 340/870.29 |
| 4,794,369 | 12/1988 | Haferd . |
| 4,803,632 | 2/1989 | Frew et al. .......................... 340/870.02 |
| 4,804,957 | 2/1989 | Selph et al. . |
| 4,811,011 | 3/1989 | Sollinger . |
| 4,817,131 | 3/1989 | Thornborough et al. . |
| 4,833,618 | 5/1989 | Verma et al. . |
| 4,850,010 | 7/1989 | Stanbury et al. . |
| 4,856,054 | 8/1989 | Smith . |
| 4,862,493 | 8/1989 | Venkataraman et al. . |
| 4,866,761 | 9/1989 | Thornborough et al. . |
| 4,868,893 | 9/1989 | Hammond . |
| 4,881,070 | 11/1989 | Burrowes et al. . |
| 4,884,021 | 11/1989 | Hammond et al. . |
| 4,893,248 | 1/1990 | Pitts et al. . |
| 4,902,965 | 2/1990 | Bodrug et al. . |
| 4,904,995 | 2/1990 | Bonner et al. . |
| 4,908,769 | 3/1990 | Vaughan et al. . |
| 4,977,482 | 12/1990 | Langdon et al. . |
| 4,992,725 | 2/1991 | Komatsu et al. . |
| 4,995,109 | 2/1991 | Arizumi et al. . |
| 4,998,102 | 3/1991 | Wyler et al. . |
| 5,010,568 | 4/1991 | Merriam et al. . |
| 5,018,192 | 5/1991 | Smith . |
| 5,025,470 | 6/1991 | Thornborough et al. ................ 379/107 |
| 5,027,056 | 6/1991 | Russillo, Jr. et al. . |
| 5,031,209 | 7/1991 | Thornborough et al. . |
| 5,032,833 | 7/1991 | Laporte . |
| 5,049,810 | 9/1991 | Kirby et al. . |
| 5,053,697 | 10/1991 | Carnel et al. . |
| 5,059,896 | 10/1991 | Germer et al. . |
| 5,061,890 | 10/1991 | Longini . |
| 5,079,510 | 1/1992 | Komatsu et al. . |
| 5,079,715 | 1/1992 | Venkatacaman et al. . |
| 5,089,771 | 2/1992 | Tanquay et al. . |
| 5,122,735 | 6/1992 | Porter et al. . |
| 5,128,988 | 7/1992 | Cowell et al. . |
| 5,134,650 | 7/1992 | Blackmon . |
| 5,155,481 | 10/1992 | Brennan, Jr. et al. . |
| 5,161,182 | 11/1992 | Merriam et al. . |
| 5,184,064 | 2/1993 | Vicknair et al. .................... 340/870.02 |
| 5,204,896 | 4/1993 | Oliver . |
| 5,214,587 | 5/1993 | Green ................................. 340/870.29 |
| 5,229,651 | 7/1993 | Baxter, Jr. et al. ....................... 307/66 |
| 5,239,575 | 8/1993 | White et al. . |
| 5,243,388 | 9/1993 | Brennan, Jr. et al. . |
| 5,252,967 | 10/1993 | Brennan, Jr. et al. . |
| 5,283,572 | 2/1994 | McClelland et al. .............. 340/870.02 |

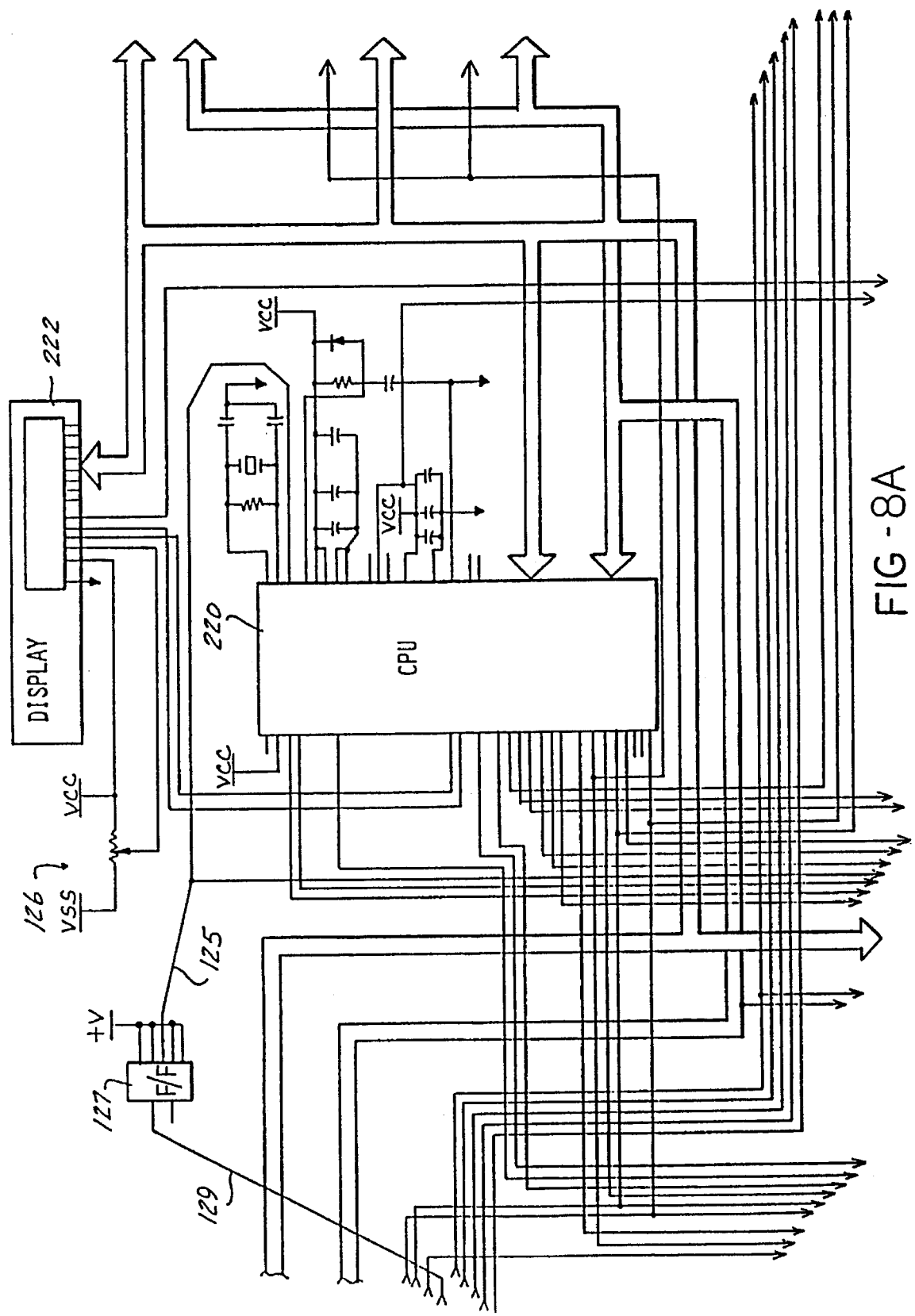

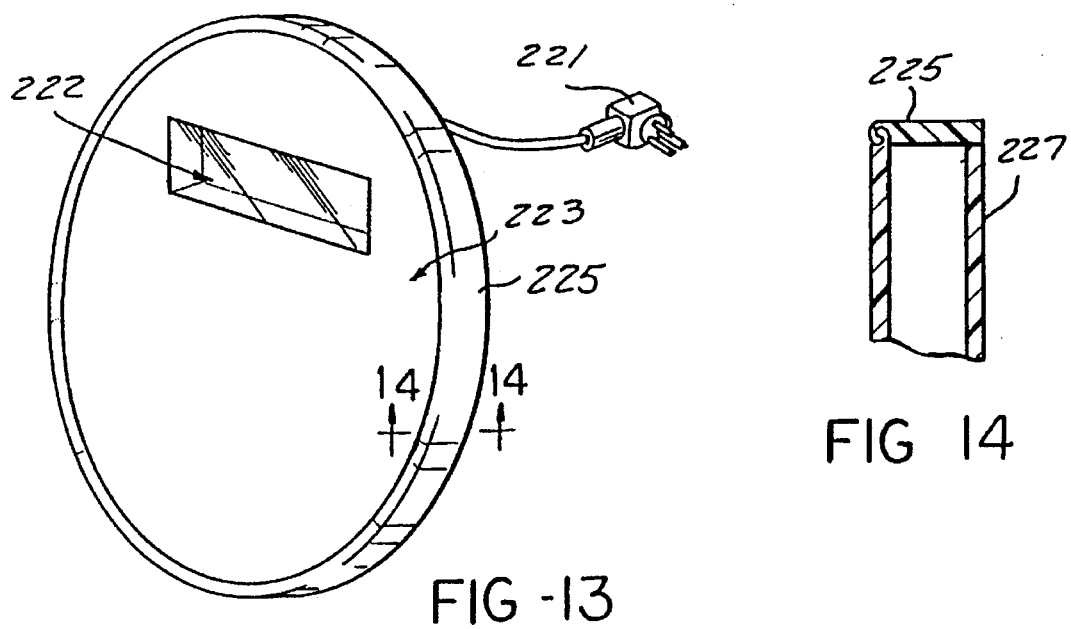
FIG -13
FIG 14
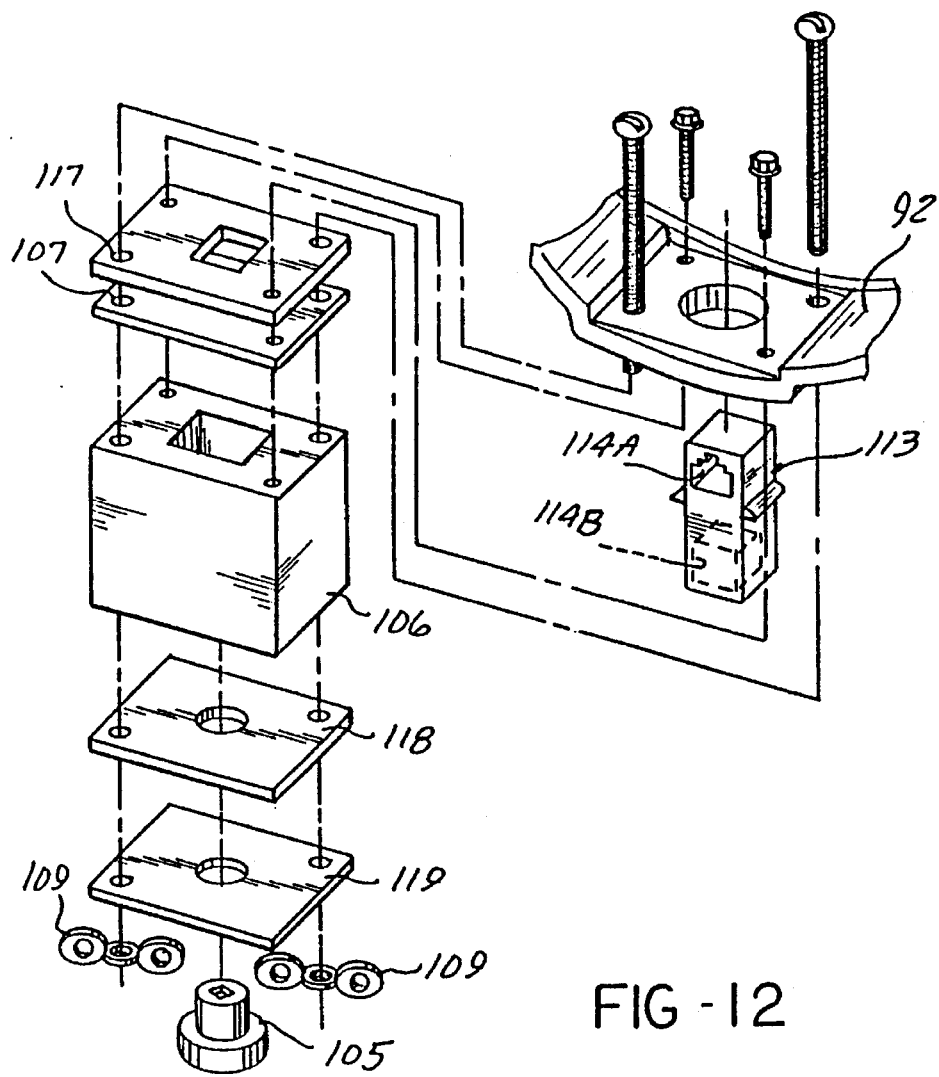
FIG -12

FIG. 16
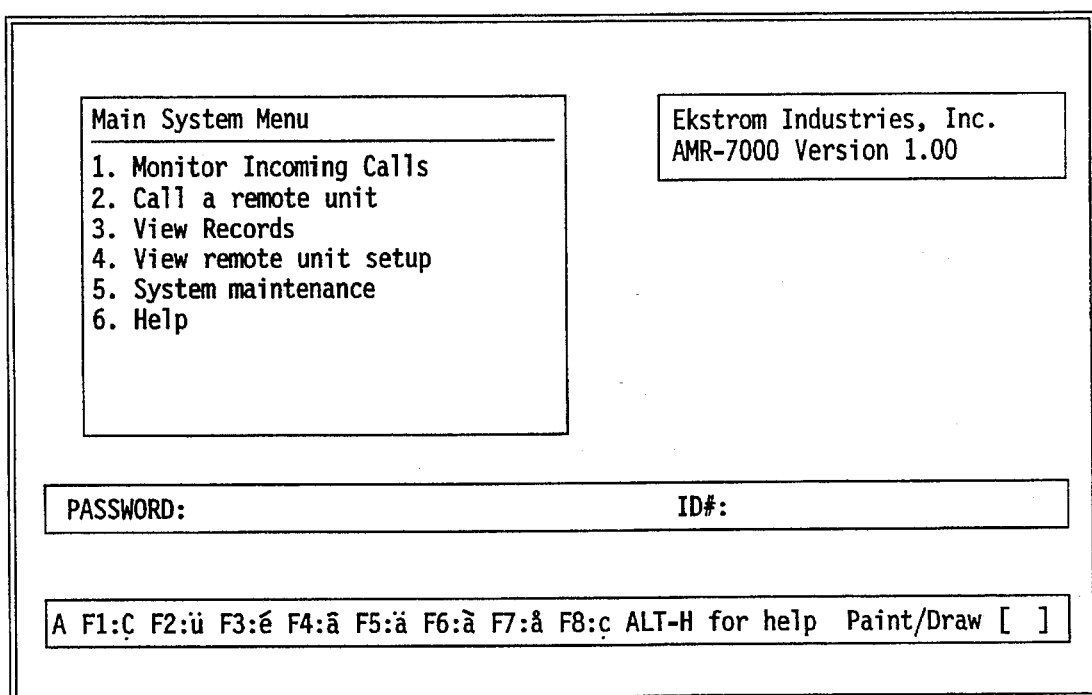
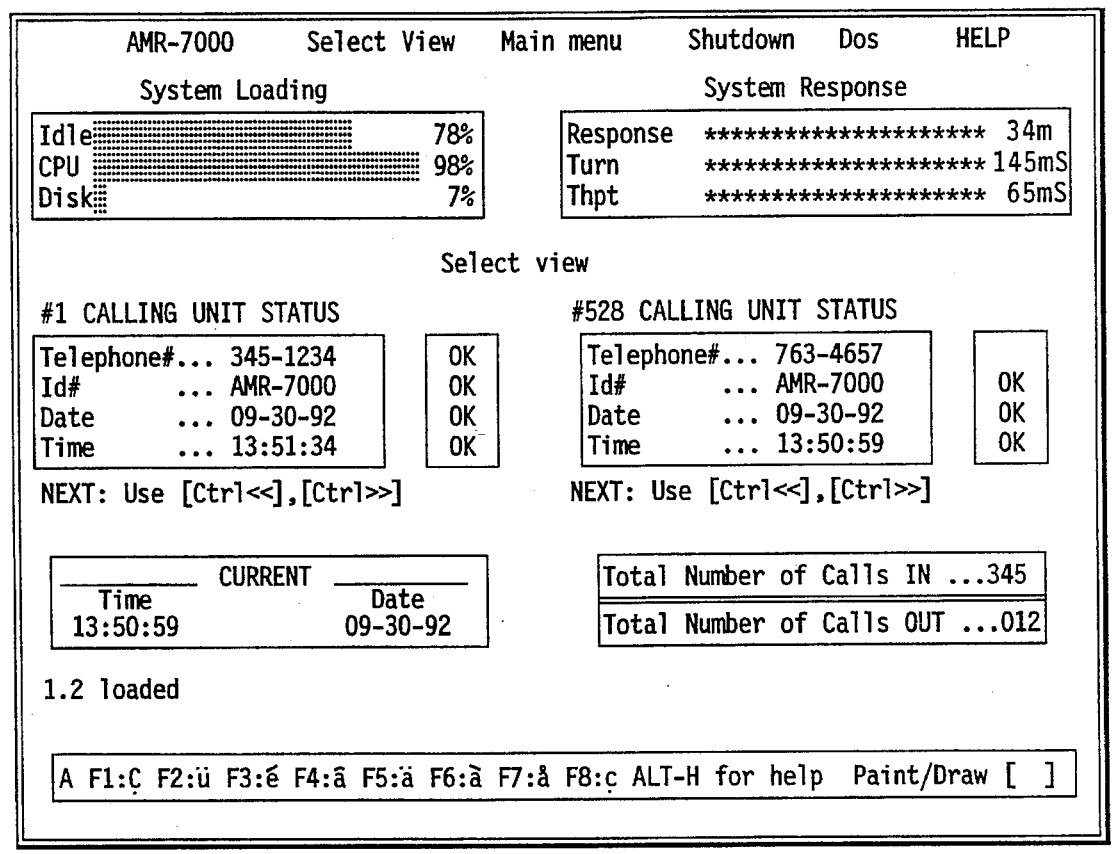
FIG. 17

FIG. 18

```
┌─────────────────────────────────────┬──────────────────────────┐
│ REMOTE UNIT ID#:  AMR-7000          │ Ekstrom Industries, Inc. │
│ TEL. NO.:  345-5432                 │ AMR-7000 Version 1.00    │
│ CODE 1  :  0007-RMA                 │                          │
│ CODE 2  :  RMA-7000                 │                          │
│ CODE 3  :  RMA-007                  │                          │
└─────────────────────────────────────┴──────────────────────────┘

┌──────────────────────────────────────────────────────────────┐
│ TO DIAL [D]   ABORT [A]    TO ENTER NEW ID# [I]   SELECT [TAB] │
└──────────────────────────────────────────────────────────────┘

┌────────────────────────────────────────────┬─────────────────┐
│ DIALING...AMR ANSWERING...HANDSHAKING...   │ TO VIEW DATA    │
│ CONNECTED...DATA...WAITING!                │ RECEIVED [R]    │
│                                            │                 │
│                                            │ HANG-UP [ENT]   │
└────────────────────────────────────────────┴─────────────────┘

2.1 loaded
A F1:C F2:ü F3:é F4:ã F5:ä F6:ã F7:å F8:ç ALT-H for help  Paint/Draw [ ]
```

```
┌────────────────────────────────────────────────────────────────┐
│ TO VIEW LAST MONTHS RECORDS [L]   PREVIOUS MENU [ESC]          │
├────────────────────────────────────────────────────────────────┤
│                                                                │
│ REMOTE UNIT ID#: AMR-7000         1107 Lambs Ln.               │
│ CURRENT READINGS:                 Dallas                       │
│ Instantaneous-                    Accumulated since last reading- │
│  Volts  L1:  123.02V               KWH        :__,__,346,678.231 │
│         L2:  117.12V               KVAR       :__,__,__.__     │
│  Amps   L1:   12.90A               PF                  98.12   │
│         L2:  126.96A               Max. Volts :       131.21V  │
│  KW         :                      Min. Volts :       099.12V  │
│  KVAR       :                      # of Outages:           5   │
│  PF         :                      Out. Duration:     21.75Hrs │
│                                                                │
│                                   ┌─TO DATE ACCUMULATED READINGS─┐
│ Access Window Programming-        │ KWH      :  __,_54,276,457.123│
│ Call-OUT                          │ KVAR     :                   │
│ Next Window: 10-30-92   13:30:00  │ PF       :   99.01           │
│ Code1:           Code3:           │ #Outages :      23           │
│ Code2:                            │ Outages Dur.:   25.12        │
│                                   └──────────────────────────────┘
│                                                                │
│ A F1:C F2:ü F3:é F4:ã F5:ä F6:ã F7:å F8:ç ALT-H for help  Paint/Draw [ ] │
└────────────────────────────────────────────────────────────────┘
```

```
TO VIEW LAST SETUP [L]        PREVIOUS MENU [ESC]          OFF LINE

REMOTE UNIT ID#: AMR-7000           Location: 1107 Lambs Ln.
Code1:  0007-RMA                              Dallas
Code2:  RMA-7000                    Name: John T. Shincovich
Code3:  RMA-0007

CALL IN/OUT:  OUT

ACCESS WINDOW: 30th Day
Time:   13:55:00                      KW     : YES/ONLY
Window Size: 5 Min.                   KVAR   : YES
Alternate1: 24 Hrs.  Size: 5 Min.     KVA    : YES
Alternate2: 48 Hrs.  Size: 5 Min.     PF     : YES
Demand1 ON: 06:30  OFF: 08:45
Demand2 ON:        OFF:               CONTROL OUT: ON/OFF
Demand3 ON: 18:00  OFF: 21:00
Tamper Switch: YES/NO
Line Quality Monitoring: YES/NO    Supervisory Number: 1-800-234-1234
                                         Alternate  :  -   -345-1232

4.0 loaded

A F1:ç F2:ü F3:é F4:ä F5:ä F6:ä F7:å F8:ç ALT-H for help  Paint/Draw [ ]
```

2

REMOTE AUTOMATIC METER READING APPARATUS

This application is a continuation of application Ser. No. 08/017,650, filed on Feb. 12, 1993, now abandoned.

BACKGROUND OF THE INVENTION

1. Field of the Invention

The present invention relates, in general, to automatic watthour meter reading apparatus and, specifically, to remote automatic watthour meter reading apparatus.

2. Description of the Art

The advantages of automatic reading of electrical watthour meters and other utility meters have long been recognized. Such advantages accrue from the elimination of the high costs associated with manually reading meters located a long distance from a central utility office, inside of a customer's premises, at dangerous locations, and at the remote ends of a distribution network. Further, in rural utility networks, long distances are typically encountered between each meter location. Thus, more employees are required to manually read each meter on a predetermined time schedule for accurate billing.

However, such advantages have not been fully attained by previously devised automatic meter reading apparatus for several reasons. Most automatic meter reading apparatus require a specially designed watthour meter containing the telephone communications circuit, the power measuring circuitry and the data accumulation circuitry. In a typical electrical utility having tens to hundreds of thousands of electrical meters, the capital cost of replacing all watthour meters with specially designed automatic reading watthour meters is extremely high. Further, a single utility system typically uses several different types of watthour meters. Converting such meters in all locations to automatic reading meters is impractical since it would require several different types of automatic meter reading apparatus thereby increasing inventory and complicating ordering, installation and service of the meters. Previously devised automatic meter reading apparatus have also had a high cost compared to conventional, single phase, mechanical rotating ring-type counter meters and have other disadvantages which have limited their widespread application.

In the context of providing an economical, easily installed, widely usable automatic meter reading apparatus for watthour meters, another factor which must be addressed is accuracy in measuring power usage. The accuracy standard for automatic meter reading apparatus is the ±2% accuracy of conventional mechanical watthour meters. Some automatic meter reading devices sense rotation of the mechanical rotating ring in a conventional watthour meter and convert the sensed rotations to digital signals corresponding to indicated power usage. Thus, such automatic meter reading devices are limited to the accuracy of the mechanical watthour meter. Electronic sensing of current and voltage for the calculation of power has also been proposed for electronic watthour meterrs. Such sensing circuits have been specifically designed for use in a specially designed electronic watthour meter. However, little attention has been paid in such single phase watthour meters for accurately measuring power consumption.

Another disadvantage of previously devised automatic meter reading devices utilizing conventional telephone lines has been the inclusion of complex telephone dialing, callback and reporting circuits to coordinate the flow of power usage information between each remote watthour meter site and the central utility office. This has increased the cost of automatic meter reading devices beyond the point of widespread economical implementation. Further, the use of dedicated telephone lines which do not interfere with a customer's telephone usage has also been proposed along with the attendant cost of running additional telephone lines to each customer site.

Another factor which has not been fully addressed by previously devised automatic meter reading devices is the desirability of having time of day and demand power control by the utility company at residential locations. The increased cost of generating electricity has required other billing approaches by utilities including time of day billing where varying rates are applied to electrical usage at different periods during each 24 hour day. Another billing approach is demand or peak billing where the amount of power consumed is billed at a higher rate for power usage exceeding a predetermined amount. In order to implement such alternate billing approaches, it is necessary for the utility company to have accurate power consumption data, such as having the ability to determine the peak load of any customer and the power usage during any time period during the day.

Thus, it would be desirable to provide an automatic meter reading device for watthour meters which overcomes the problems of previously devised automatic meter reading devices. It would also be desirable to provide an automatic meter reading device which is usable with conventional watthour meters without requiring modifications to such watthour meters or the meter socket. It would also be desirable to provide an automatic meter reading device for watthour meters which utilizes data communication via conventional telephone lines with a central utility site. It would also be desirable to provide an automatic meter reading device for watthour meters which is usable with most of the many different types of watthour meters currently used by utility companies.

SUMMARY OF THE INVENTION

The present invention is a remote automatic meter reading apparatus which is capable of sensing, calculating and storing power consumption values at a plurality of electrical utility customer sites and communicating such power consumption values via a communication interface to a central utility site.

Generally, the automatic meter reading apparatus of the present invention includes a central processing means, disposed at the central utility site, which executes a stored program to interrogate automatic meter reading equipment at each of a plurality of remotely located utility customer sites and to receive, process and store power consumption values communicated from each remote customer site. A communication interface means communicates data signals between the central utility site and each of the remote customer sites. The communication interface may comprise conventional telephone conductors with modems employed at the central utility site and each remote customer site.

Current sense means are coupled to the electrical power conductors at each customer site for sensing the instantaneous current of the electrical load at each customer site. Voltage sense means are also coupled to the electrical power conductors at each customer site for sensing the instantaneous voltage at each customer site. The current and voltage values are digitized in an analog to digital converter in the remote automatic meter reader apparatus at each customer site under the control of a processor means which executes a stored program and integrates the sensed and digitized instantaneous current and voltage values over time to generate power consumption values in kilowatt hours and/or KVA which are stored in a memory in the remote automatic meter reader apparatus at each customer site.

A communication protocol established by the control program executed by the central processor means at the central utility site interrogates the processor means at each customer site on a predetermined time basis to receive the calculated power consumption values therefrom for use in customer billing and for other purposes. Additionally, low voltage and high voltage limits can be programmed into the automatic meter reading apparatus at each customer site from the central utility to insure compliance with applicable regulatory rules.

In a preferred embodiment, the remote automatic meter reading apparatus at each customer site is mounted in an electrical watthour meter socket adapter which plugs into the standard watthour meter socket at each customer site and which may receive a conventional watthour meter therein. In the preferred embodiment, the current sense means comprises coils disposed about the blade terminals in the socket adapter which are connected to the electrical power conductors when the socket adapter is plugged into the watthour meter socket. The voltage sense means comprises amplifiers connected to the electrical load terminals in the socket adapter which sense the instantaneous voltage at each customer site. The processor means, associated memory, communication interface, analog to digital conversion, and power supply are also mounted in the socket adapter.

A power outage monitoring program is stored in memory in each remote automatic meter reading unit and senses, totals and stores information for monitoring the frequency and duration of power outages at the associated customer site. This power outage information is reportable to the central utility site on demand and/or along with the transmission of power consumption data to the central utility site.

The automatic meter reading apparatus of the present invention enables remote automatic meter reading capabilities to be coupled with a conventional watthour meter without requiring any modification to the conventional watthour meter or watthour meter sockets. The automatic meter reading apparatus of the present invention is mountable in a watthour meter socket adapter so as to be easily employed at each remote customer site.

BRIEF DESCRIPTION OF THE DRAWING

The various features, advantages and other uses of the present invention will become more apparent by referring to the following detailed description and drawing in which:

FIGS. 8A, 8B and 8C are detailed schematic diagrams of the microcontroller and memory circuits shown generally in FIG. 5.

FIG. 12 is an exploded, perspective view of the telephone line connector enclosure;

FIG. 13 is a perspective view of an optional cover and display;

FIG. 14 is a cross sectional view generally taken along line 14—14 in FIG. 13;

FIGS. 16–20 are pictorial representations of menu screens depicting the modes of operation of the control program of the central processing unit.

DESCRIPTION OF THE PREFERRED EMBODIMENTS

Figure 1:
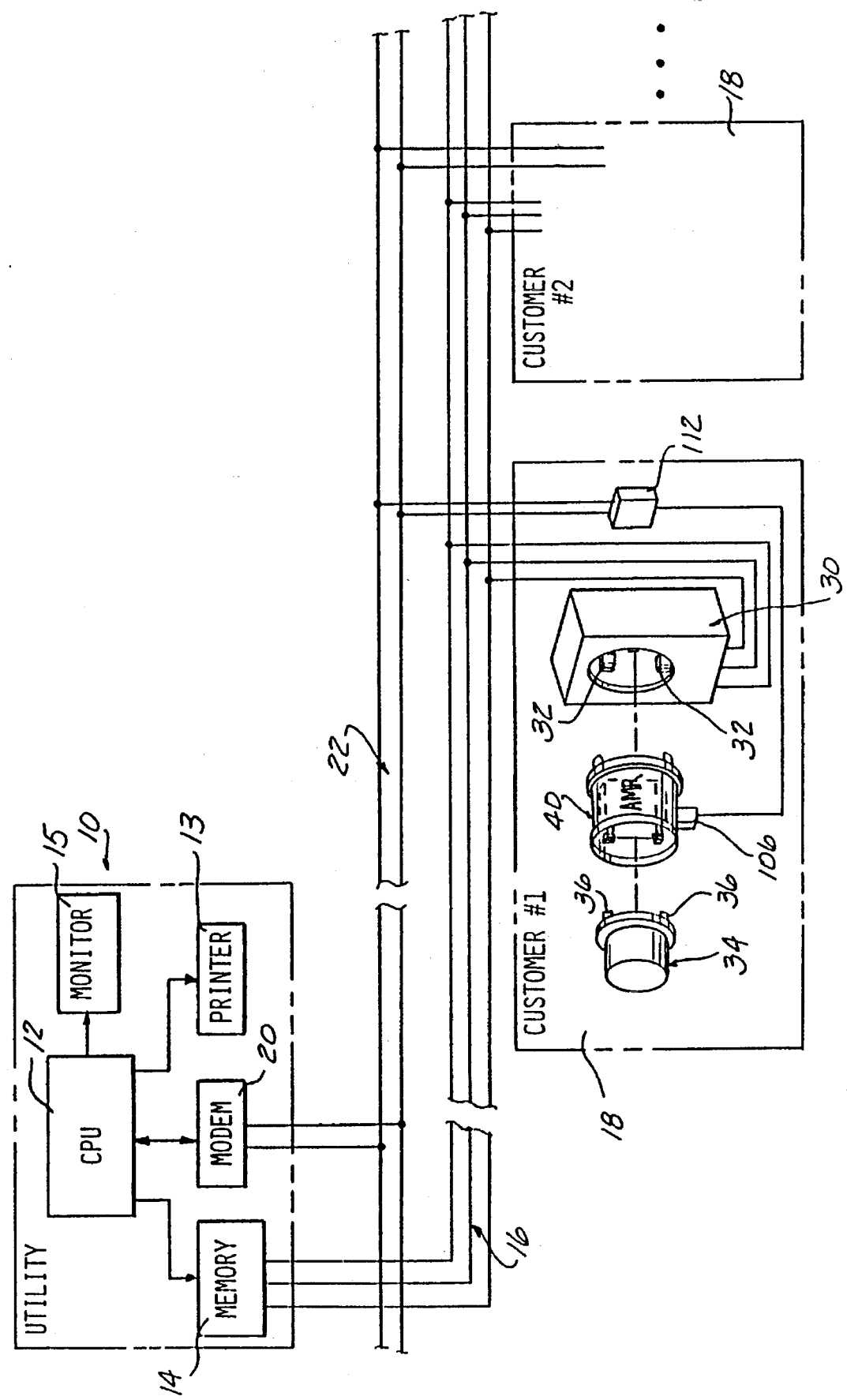
FIG. 1 is a schematic diagram of an automatic watthour meter remote reader apparatus according to the present invention.

Referring now to the drawing, there is depicted an automatic meter reader apparatus particularly suited for automatic reading of electrical watthour meters located remotely from a central utility site or office.

Central Utility

As shown in FIG. 1, a central utility company site is depicted generally by reference number 10. The central utility site 10 may be the central business office of the utility, a generating station, etc., where billing information is accumulated, tabulated and recorded. A central processing unit 12 is located at the site 10. The central processing unit 12 may be any suitable computer, such as a mainframe, a PC, a PC network, workstation, etc., having the capacity of handling all of the utility company customer billing transactions as well as the remote data communications, .as described hereafter. For example, a 386 based PC may be employed. The central processing unit 12 communicates with a memory 14 which stores data specific to each utility customer, as well as other data regarding power usage of each customer. The memory 14 comprises both hard disc storage memory and on board volatile memory. Although high voltage, electrical power distribution lines denoted generally by reference number 16 for a three-wire, single-phase electrical system, are shown as extending from the central utility site 10 to each utility customer denoted generally by reference number 18, it will be understood that the electrical power distribution lines 16 may extend from a separate electrical power generating site through electrical transmission lines with appropriate voltage transformations, and not directly from the central utility site 10. Further, it will be understood that the electrical power distribution lines 16 may provide three-phase power to each customer site 18.

As shown in FIG. 1, various input and output devices, such a keyboard, printer(s) 13, display terminals or monitors 15, etc., may also be connected to the central processing unit 12 as is conventionally known. In addition, one or more modems 20 are connected to the central processing unit 12 at the central utility site 10 and to conventional telephone wiring circuits denoted generally by reference number 22 which extend to each utility customer site 18. The number of modems 20 matches the number of telephone lines between the central site 10 and all of the customer sites 18. Each modem is capable of handling a large number of remote customer units 18, such as, for example, 2880 remote customer units 18, based on the assumption that a telephone call to a remote unit 18 is made every five minutes during a twelve hour period each day and for only the approximate twenty days per monthly billing period. The telephone wiring circuits 22 may be conventional telephone wires, as well as fiber optics, satellite, microwave or cellular telephone communication systems. The modem 20, which may be any conventional modem, functions in a known manner to communicate data between the central processing unit 12 and each utility customer site 18, as described in greater detail hereafter.

Also stored in the memory 14 are the various software control programs used by the central processing unit 12 to automatically communicate with the electrical watthour meter at each utility customer site 18 as described hereafter. The memory 14 also stores the power usage data for each utility customer as well as various billing routines utilized by a particular utility company.

Generally, the software control program stored in the memory 14 is a menu driven database capable of handling multiple simultaneous calls to a number of remote automatic meter reader circuits. The control program stores each customer's power usage in accumulated KWH and KVA, and instantaneous voltage, current and power factor measurements. Also, the control program generates an end-of-day summary printout through a printer 13.

The control program also enables a utility employee to remotely program each automatic meter reading circuit at the central site 10. Such programmable features include time, date and year data, a multi-level security code for communication access, receive call and originate call modes, line voltage quality set points, start and end times for multiple demand billing period intervals, i.e., three intervals in each 24 hour period, the date, time and duration of a communication window for communication with the central site 10, and the date and on or off conditions of a relay at the remote site 18.

FIG. 16 depicts the main system menu which appears on the monitor 15 at the central site 10. The main system menu provides various options which may be selected by the user to monitor incoming calls from the remote AMR units, to call a specific remote unit, to review the records of any remote unit, to review a remote unit setup, to utilize system maintenance or a general help selection.

FIG. 17 depicts a menu screen which is generated when the first option in the main system menu entitled "monitor incoming calls" is selected. As shown in FIG. 17, two remote AMR units are currently calling or are about to call the central processing unit for the transmission of data to the central site. The telephone number and identification number of each remote AMR unit currently transmitting data to or about to transmit data to the central site are depicted on the screen shown in FIG. 17.

FIG. 18 depicts a screen on the monitor 15 at the central site when option 2 in the main menu is selected to call a specific remote AMR unit. This screen is preceded by another screen, not shown, which requires the user to enter his or her pass code and then the specific identification number of the remote AMR unit to be called. When the correct information is entered, the screen shown in FIG. 18 will be displayed on the monitor 15 at the central site. If three erroneous pass codes are entered by the user, the control program of the central processing unit 12 will prevent further access to the system.

FIG. 19 depicts the screen for option 3 in the main menu which enables a user at the central site 10 to view the records or data from a particular remote AMR unit. The instantaneous voltage and current readings on each of the incoming power line conductors at the time of the call to the selected remote AMR unit are displayed on the screen. Also, the maximum and minimum voltage on the line conductors, the number and duration of outages as well as accumulated KWH, KVAR and power factor (PF) since the last reading are depicted. Total KWH, KVAR and power factor readings to date are also shown as well as total power outages and power outage durations.

Finally, FIG. 20 depicts a screen when option 4 on the main system menu is selected to view a remote AMR unit setup. All of the programmable information of a particular selected remote AMR is displayed in the screen shown in FIG. 20. This information includes the day, time in hours, minutes and seconds and the window duration of the primary data communication window to the selected AMR unit. The first and second alternate data communication windows and their duration are also shown. Power demand settings for a particular unit, if employed, are also depicted on the screen. Any of these values may be programmed into a specific remote AMR unit from the central site.

At appropriate times, as determined by the utility company, the power consumption data from each remote AMR unit can be input to a suitable billing software program to generate bills for each customer. By way of example only, the power consumption values transmitted from each AMR unit to the central site, as described above, can be stored in a hard disk which can then be transferred to a separate billing computer system at the utility company to generate customer bills.

Remote Utility Customer

Figure 2:
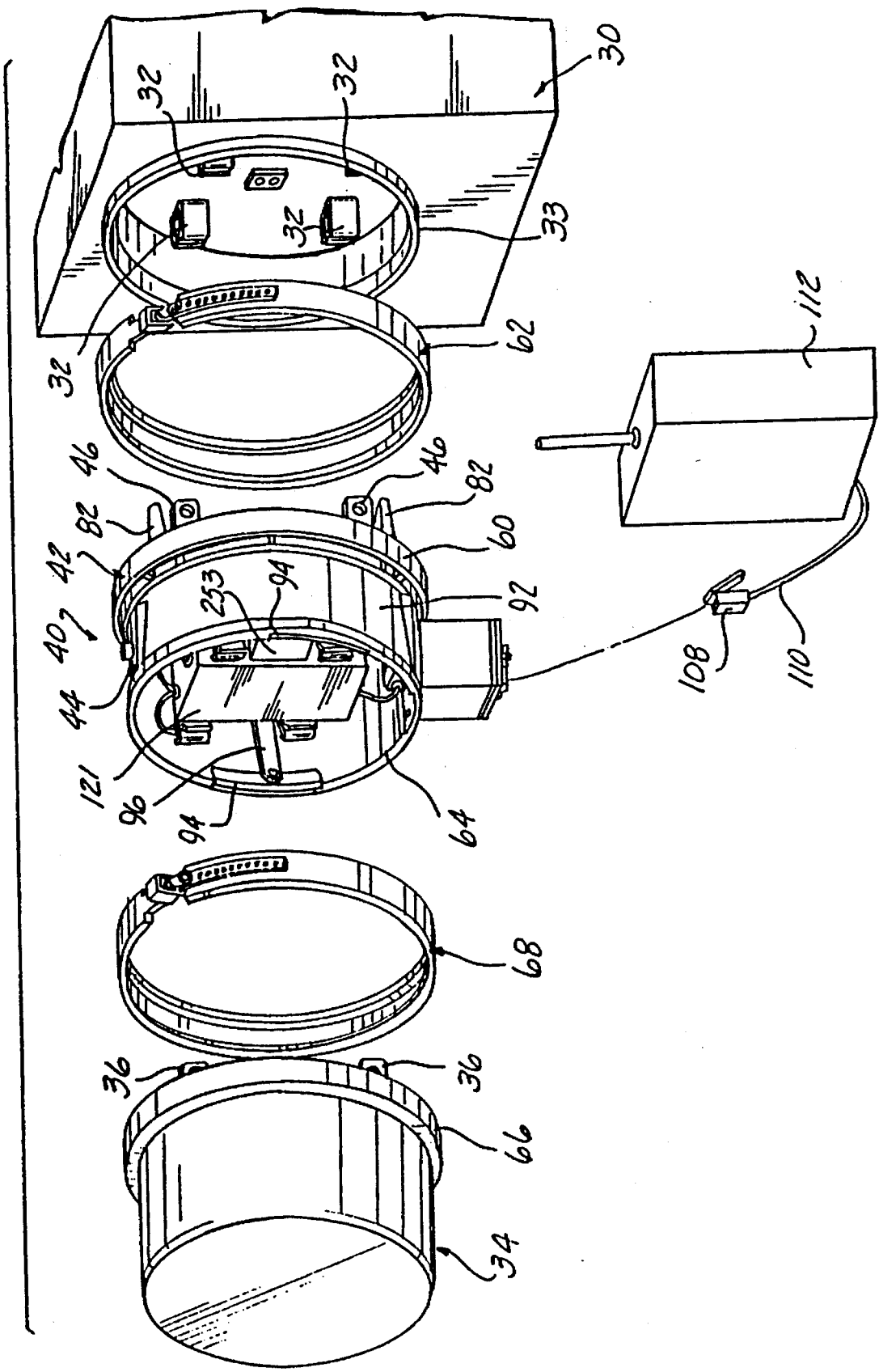
FIG. 2 is an exploded, perspective view showing the mounting of a watthour meter and a socket adapter having automatic meter reading circuitry of the present invention contained therein in a conventional watthour meter socket.

As shown in FIGS. 1 and 2, a plurality, such as tens or even hundreds or thousands of utility customer sites 18 are connected to the electrical power distribution network 16 at remote locations of varying distances from the central utility company site 10.

As is conventional, each utility customer site 18, as shown in FIG. 1, includes a utility meter socket 30 having a plurality of internally mounted jaw terminals 32 which are connected to the single-phase three-wire line conductors of the electrical distribution network 16. Although not shown in FIG. 1, separate jaw terminals are provided in the socket 30 and connected to the individual service or load conductors at each utility customer site 18. In a conventional usage, the socket 30 is mounted at a suitable location at the utility customer site 18, such as on an exterior wall, with the load conductors extending from the socket 30 to the building wiring circuits.

A conventional electrical watthour meter 34 for recording electrical power usage at a particular customer site 18 has a plurality of outwardly extending blade-type electrical terminals 36 which electrically engage the jaw contacts or terminals 32 in the socket 30. A sealing ring, depicted in FIG. 2 and described in detail hereafter, is provided for sealingly attaching the watthour meter 34 to a peripheral mounting flange 33 surrounding an opening in the front cover of the socket 30 to lockingly attach the watthour meter 34 to the socket 30 and to prevent unauthorized removal or tampering therewith.

AMR Socket Adapt

Figure 3:
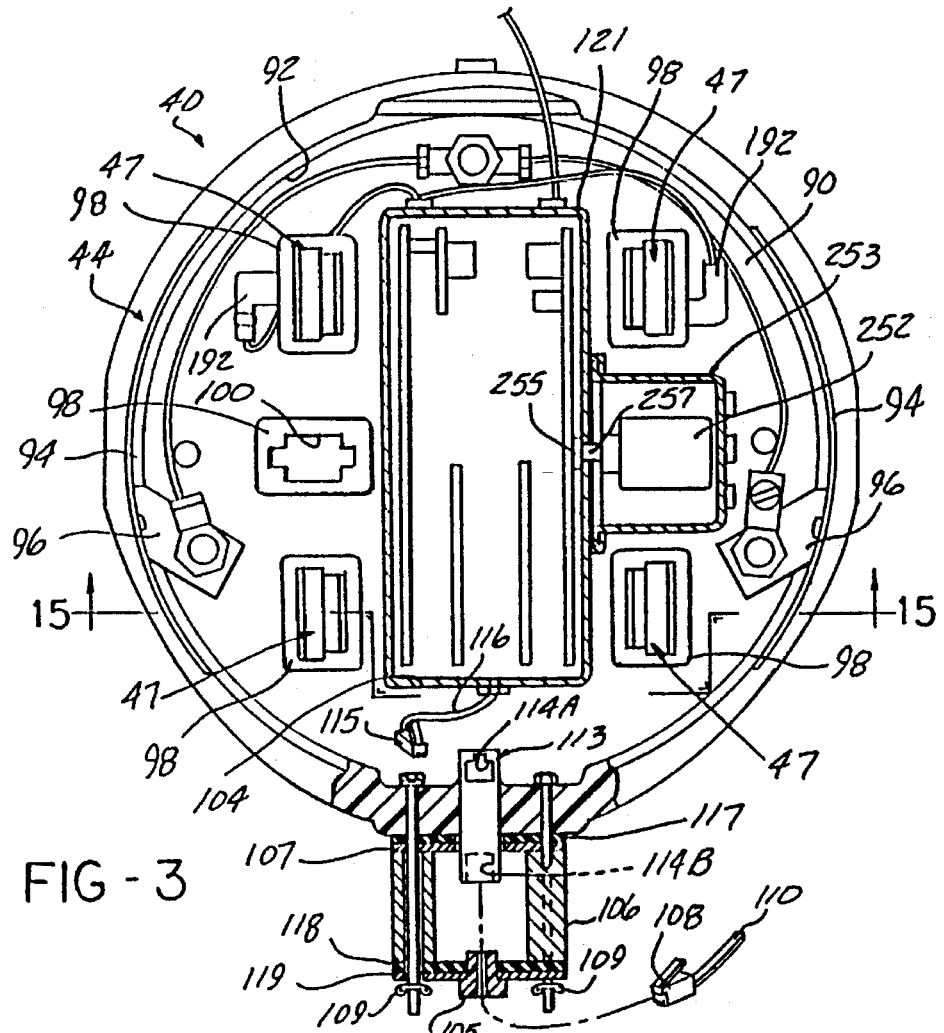
FIG. 3 is a front elevational view of the socket adapter shown in FIG. 2.
Figure 4:
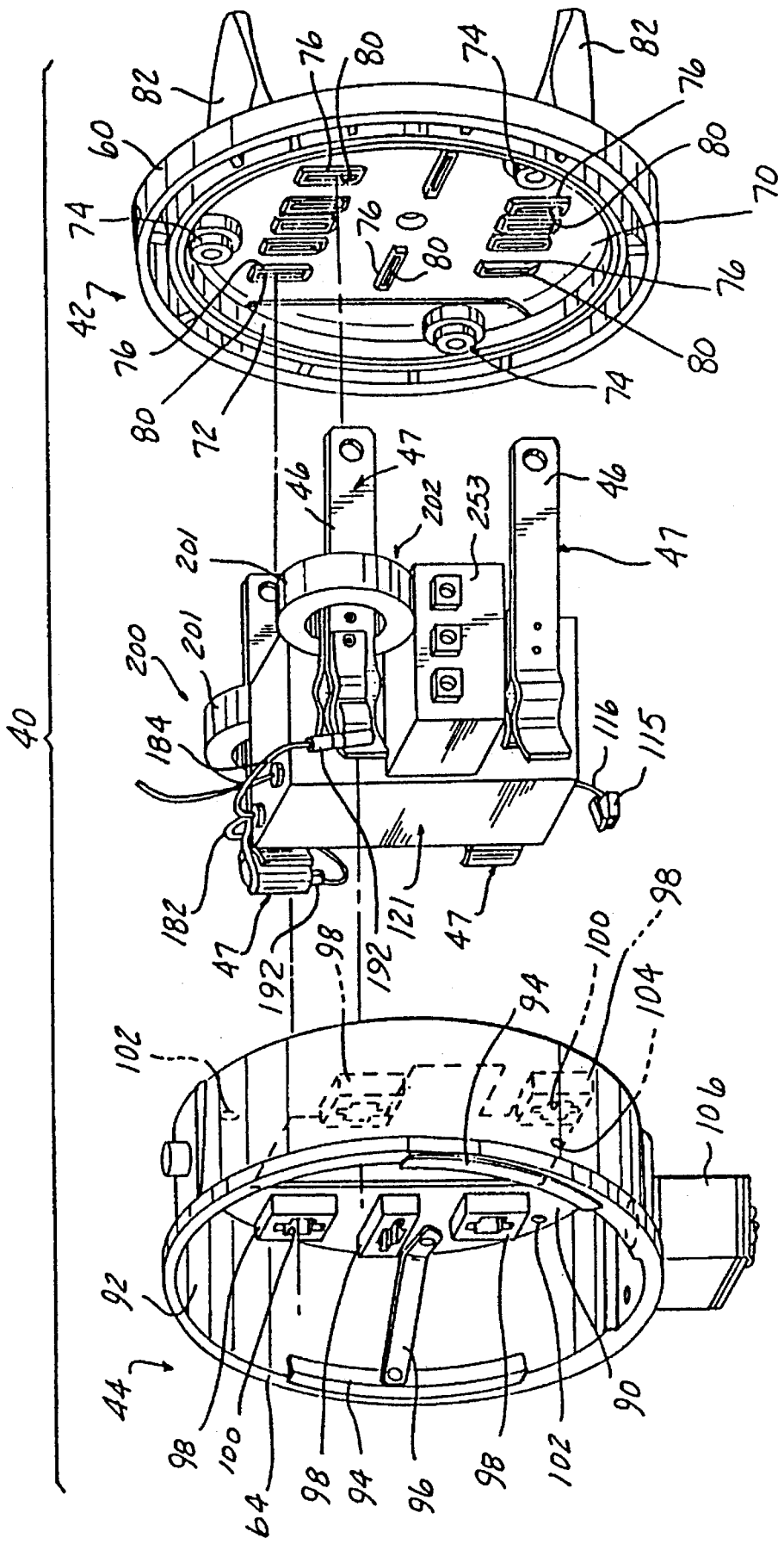
FIG. 4 is an exploded, perspective view showing the base and shell portions of the socket adapter shown in FIG. 2.

As shown in FIGS. 1 and 2, and in greater detail in FIGS. 3 and 4, the automatic meter reader apparatus of the present invention, in a preferred embodiment, includes a socket adapter denoted generally by reference number 40. The socket adapter 40 is interconnected between the watthour meter 34 and the socket 30 in a known manner. However, according to the present invention, the socket adapter 40 includes internally mounted automatic meter reading and telephone communication circuits as described in greater detail hereafter. The use of the socket adapter 40 to house the automatic meter reading circuitry is a preferred embodiment of the present invention. It will be understood that such automatic meter reading circuitry, as described hereafter, can also be mounted at each customer site 18 by other means, such as in an enclosure separate from the watthour meter and meter socket.

In general, the watthour meter socket adapter 40 includes a two-part housing formed of a base 42 and a shell 44 which are joined together by fasteners. As described hereafter, a plurality of electrical contacts 47 are mounted in the socket adapter 40 and have a first end 46 extending outward from the base 42 for removable engagement with the jaw-type electrical contacts mounted in the watthour meter socket 30. The electrical contacts 47 are provided in the socket adapter 40 in any number, type and arrangement depending upon the electrical power requirements of a particular application. By way of example only, the electrical contacts 47 are arranged in the socket adapter 40 in a first line pair of contacts and a second load pair of contacts. Each of the contacts receives one of the blade-type electrical terminals 36 mounted on and extending outward from the watthour meter 34. Each of the contacts is preferably in the form of a pair of spring-biased fingers which are formed of an electrically conductive material. The jaws of each electrical contact in the socket adapter 40 are joined together to form a single blade-like terminal extending outward at a first end 46 from the base 42 of the socket adapter 40.

As is conventional, a peripheral flange 60 is formed on the base 42 of the socket adapter 40 which mates with a similarly formed flange 33 on the watthour meter socket or housing 30 for mounting of the watthour meter socket adapter 40 to the watthour meter socket 30. A conventional seal or clamp ring 62, such as a seal ring disclosed in U.S. Pat. No. 4,934,747, the contents of which are incorporated herein by reference, is mountable around the mating flanges 60 on the socket adapter 40 and the flange 33 on the socket 30 to lockingly attach the socket adapter 40 to the socket 30 and to prevent unauthorized removal of or tampering with the socket adapter 40.

It will also be understood that the socket adapter 40 and the socket 30 may be configured for a ringless connection. In this type of connection, not shown, the cover of the socket 30 is provided with an aperture which is disposable over the socket adapter housing and locked to the socket 30 enclosure after the socket adapter 40 has been inserted into the socket 30.

As shown in FIG. 2, a second mounting flange 64 is formed at one end of the shell 44 of the socket adapter 40. The mounting flange 64 mates with a similarly configured mounting flange 66 formed on the watthour meter 34. A second sealing ring 68, which may be identical to the sealing ring 62, described above, is lockingly disposed about the mating flanges 64 and 66 to lockingly attach the watthour meter 34 to the socket adapter 40.

Figure 15:
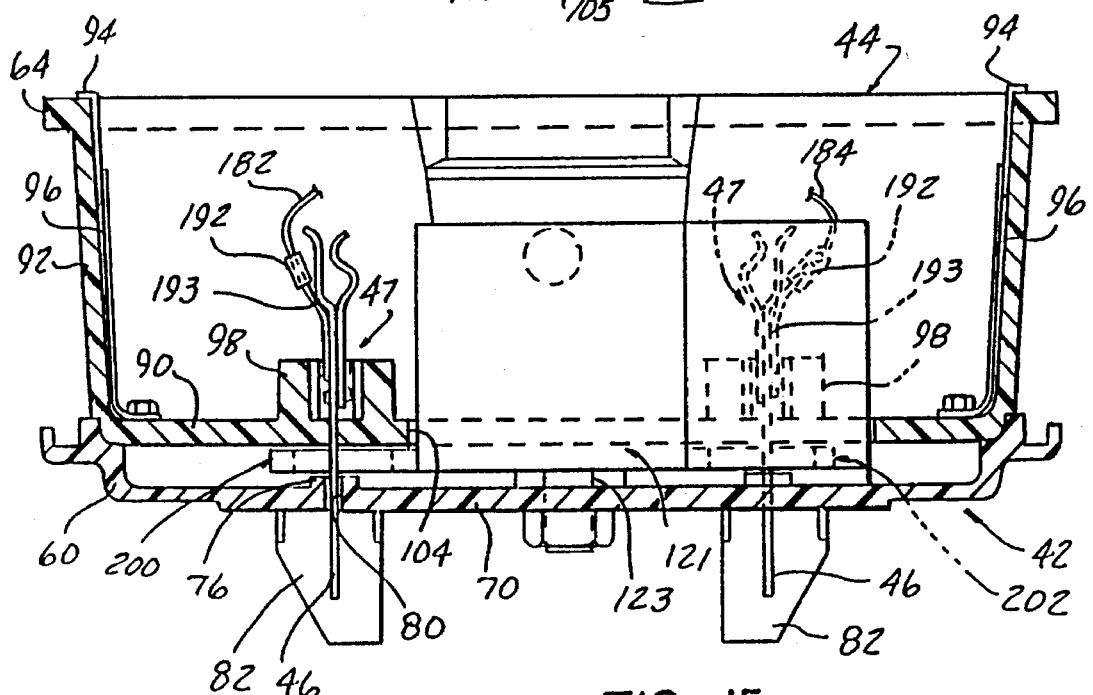
FIG. 15 is a cross sectional view generally taken along line 15—15 in FIG. 3.

As shown in greater detail in FIGS. 4 and 15, the base 42 of the socket adapter 40 includes a central wall 70 which is integrally formed with and surrounded by an annular, peripheral side wall 72. The side wall 72 extends outward from the central wall 70 for a predetermined distance to form an internal recess or cavity in the base 42. The outer portion of the side wall 72 is configured as the rim or mounting flange 60 for mating engagement with the mounting flange 33 on the socket 30.

A plurality of mounting bosses 74 are integrally formed on the central wall 70 and the side wall 72 at prescribed locations for connecting the base 42 to the shell 44 by suitable fasteners, as described hereafter. In addition, a plurality of spaced bosses 76 are formed on and extend outward from the central wall 70. Each of the bosses 76 includes a central aperture 80. The aperture 80 is preferably in the form of a slot for receiving the blade terminals mounted in the shell 44 therethrough, with the exterior end 46 of the blade terminals extending outward from the back surface of the central wall 70 of the base 42 in the orientation shown in FIG. 4.

Lastly, protective flanges 82 are formed on the back surface of the central wall 70 adjacent to each blade terminal to provide protection for the exterior end 46 of each blade terminal in a conventional manner. The base 42 and its various described elements is preferably formed as a one-piece molded member from a suitable, electrically insulating, plastic material.

Referring now to FIGS. 3, 4 and 15, the shell 44 of the socket adapter 40 includes a base wall 90 and an annular side wall 92 disposed at the periphery of the base wall 90 and extending away from the base wall 90 to form an interior cavity or recess within the shell 44. The outer end of the annular side wall 92 is formed with a rim or mounting flange 64 for mating engagement with the mounting flange 66 on a watthour meter 34, as shown in FIG. 2 and described above.

Surge protection strips 94 are mounted on the exterior peripheral edges on opposite sides of the mounting flange 64. Electrically conductive tabs 96, only one of which is shown in FIG. 4, extend from the strips 94 to the bottom wall 90.

A plurality of terminal bosses, each denoted by reference number 98, are integrally formed on and extend outward from the bottom wall 90 into the cavity formed between the bottom wall 90 and the annular side wall 92. Each of the bosses 98 includes an internal bore 100 which mountingly receives a suitable jaw-type terminal. A plurality of apertures are formed in the bottom wall 90 and receive suitable fasteners, not shown, to attach the shell 44 to the bosses 74 in the base 42.

It will be understood that the number, position and arrangement of the bosses 98 may vary from that shown in FIGS. 3 and 4 to other arrangements depending upon the particular electrical power requirements at a utility customer site 18 at which the socket adapter 40 and socket 30 are employed.

A cutout or aperture 104 having an irregular shape is formed in the bottom wall 90 of the shell 44 for mounting of the automatic meter reading circuitry therethrough, partially within the interior cavity in the shell 44 and partially within the interior cavity between the bottom wall 90 of the shell 44 and the central wall of the base 42.

As shown in FIGS. 2, 3 and 12, a telephone line connector sleeve 106 is mounted to the annular side wall 92 of the shell 44 by suitable fasteners, not shown. The sleeve 106, in one embodiment, has a generally tubular construction with either a square, rectangular, circular, etc., cross sectional shape.

As shown in FIG. 12, a metallic mounting plate 117 having a central aperture and fastener receiving apertures is mounted adjacent the flat portion formed in the bottom of the annular side wall 92 of the shell 44. A gasket 107 formed of a suitable seal material has the same configuration as the plate 117 and is sandwiched between the plate 117 and one end of the sleeve 106.

Screws extend through certain of the apertures in the annular side wall 92 of the shell 44, the plate 117, the gasket 107 and one end of the sleeve 106 to securely and sealingly attach the sleeve 106 to the annular side wall 92 of the shell 44.

A telephone connector 113 containing two female-type telephone jacks two conventional RJ11 telephone connection jacks 114A and 114B is mounted in a snap-in fit in the upper portion of the sleeve 106. The connector extends through the gasket 107, the mounting plate 117 and the annular side wall 92 to dispose one of the connection jacks 114A within the interior of the shell 44. The telephone connection jack 114A removably receives a telephone jack 115 which is attached to telephone line conductors 116 extending to the telephone modem circuitry in the AMR. The other telephone connector 114B is adapted to removably receive a telephone jack 108 attached to one end of a telephone wire conductor 110. The telephone wire conductor 110 is connected in a known manner to a telephone junction box 112 which is typically mounted at the utility customer site 18 adjacent to the watthour meter socket 30. Conventional telephone wires extend from the junction box 112 to the telephone wire network 22, as shown in FIG. 1.

The sleeve 106 is sealingly closed so as to be accessible separate from access to the interior of the socket adapter 40. A gasket 118 and a cover plate 119, each having the same configuration are attached to the opposite end of the sleeve 106 and secured thereto by means of fasteners, such as threaded studs which extend through certain apertures in the annular side wall 92 of the shell, the plate 117, the gasket 107, the sleeve 106, the gasket 118 and the cover plate 119. The exterior ends of the studs receive wing nuts 109 to securely and yet removably attach the cover plate 119 to the sleeve 106. The wing nuts 109 have apertures for receiving a conventional seal wire to provide tamper indication. A strain relief 105 is mounted in a snap-in fit in the cover plate 119 and receives the telephone conductor 110 therethrough. In this manner, the high electrical power connections within the socket adapter 40 are separate from the telephone line connections within the sleeve 106. Telephone personnel may access the sleeve 106 by removing the cover plate 119 and inserting the telephone connector 110 and telephone jack 108 through the strain relief 105 into connection with the telephone connector 114B mounted within the sleeve 106 to connect the AMR to the telephone junction box 112 and the telephone wire network 22. The wing nuts 109 are then threaded onto the studs to securely retain the cover plate 119 on the sleeve 106. A seal wire, not shown, is passed through the apertures in the wing nuts 109 to indicate a sealed, non-tampered condition for the telephone sleeve 106.

It will also be understood that other types of telephone communication means, rather than hard wire conductors, may also be employed. Such communication means may include fiber optic cables as well as satellite, cellular, microwave or other telephone communication means. With such communication networks, suitable connectors will be provided in the sleeve 106 attached to the shell 44 to provide electrical data communications between the automatic meter reader circuitry mounted within the socket adapter 40 and the telephone communication network to provide data communications between the automatic meter reader circuitry at each utility customer site 18 and the central utility site 10, as shown in FIG. 1.

AMR Circuitry

Figure 5:
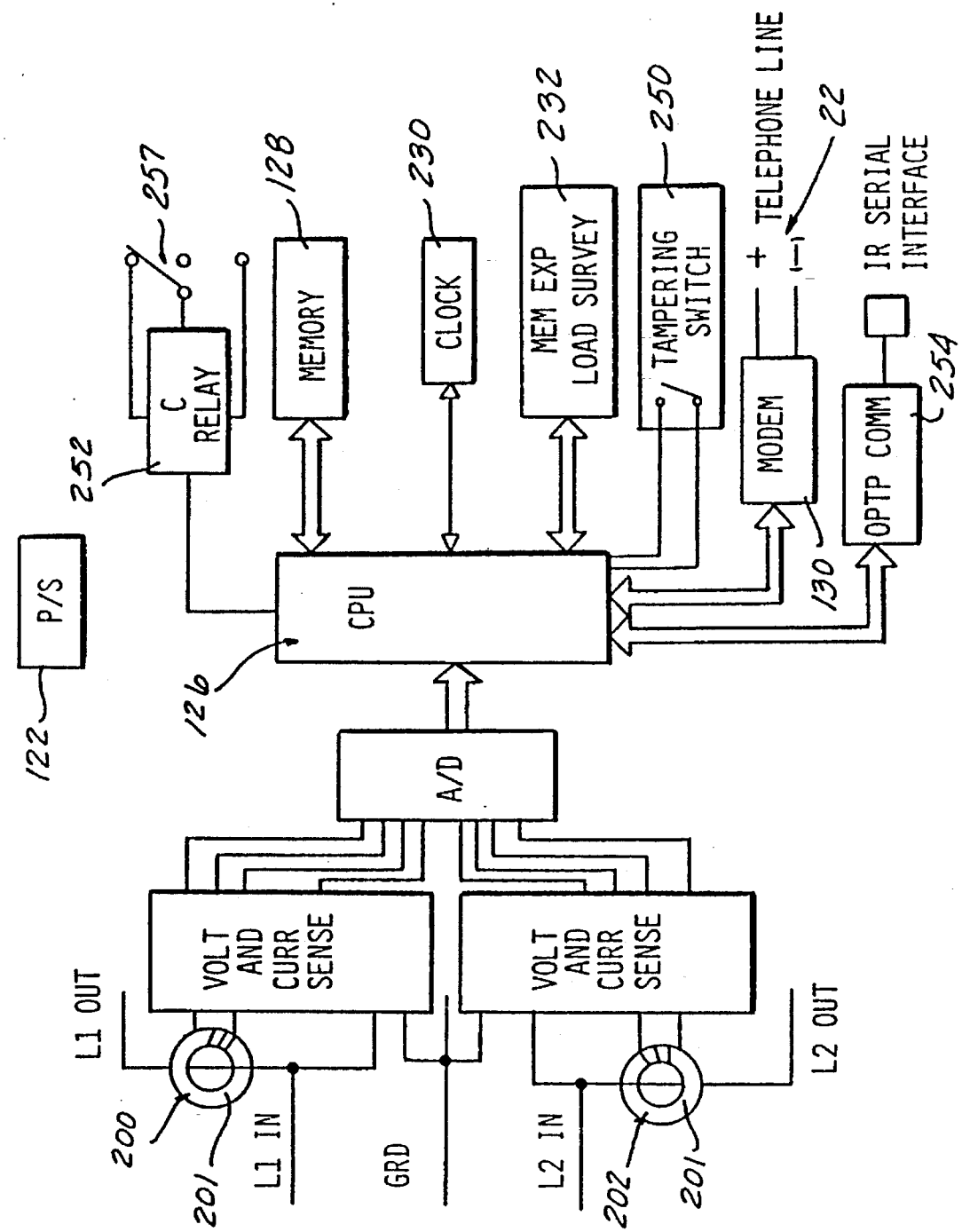
FIG. 5 is a block diagram of the automatic meter reader circuitry mounted in the socket adapter shown in FIG. 2.

A general block diagram of the major components of the automatic meter reader (AMR) circuitry denoted generally by reference number 120 which is mounted in each socket adapter 40 at each utility customer site 18 is shown in FIG. 5. The automatic meter reader circuit 120 includes a power supply 122, voltage and current sensing, analog to digital conversion circuits 124, a central processing unit and associated logic 126, a memory 128, a telephone communication modem 130, an opto-communication port 254, a RAM clock 230, an auto-tampering switch 250 and a form C relay control 252 with associated solid state switch. The details of each of these major components will now be described with reference to FIGS. 5–9.

As shown in FIGS. 3, 4 and 15, the AMR circuitry is mounted within a housing 121 having a shape sized to fit within the opening 104 in the bottom wall 90 of the shell 44. By way of example only, the housing 121 generally has a cubical rectangular shape. A threaded stud 123 extends outward from the back wall of the housing 121 and extends through an aperture formed in the central wall 70 of the base 42 where it is attached by a suitable nut to retain the housing 121 in a fixed relationship within the base 42. The housing 121 is provided with a back wall, side walls and a removable cover. The cover is removable to enable access to the components of the AMR circuitry mounted therein. As shown in FIG. 4, grommets 125 are mounted on the top and bottom and provide a sealed connection for various electrical conductors extending from the AMR circuitry exteriorly of the housing 121.

The housing 121 is preferably formed of a suitable metal so as to provide an electric shield for the AMR circuitry mounted therein. Alternately, the housing 121 may be formed of a plastic, such as an injection molded plastic, with a thin metal coating sprayed or otherwise formed on the interior surface thereof to form the electrical shield.

Figure 6:
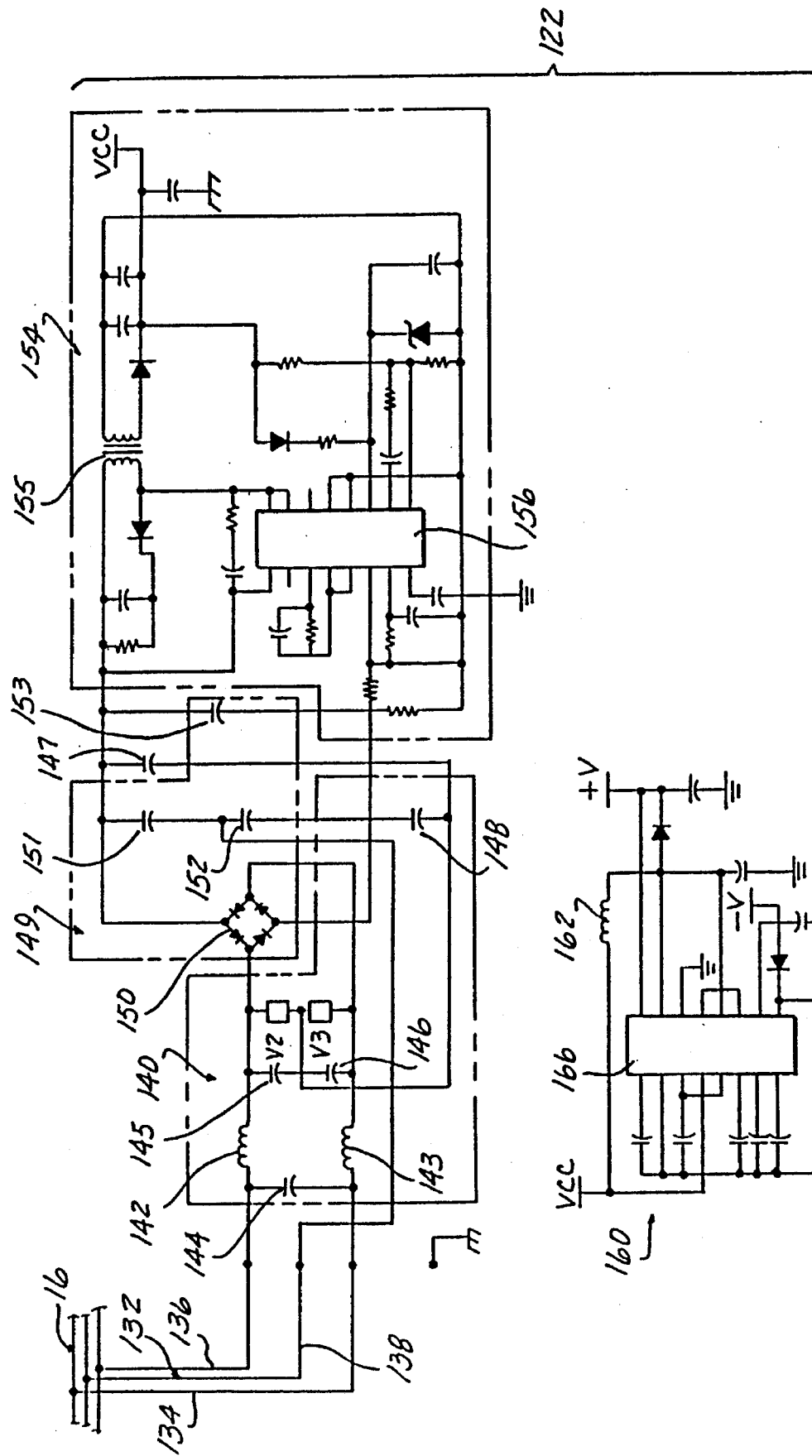
FIG. 6 is a detailed schematic diagram of the power supply shown in FIG. 5.

As is conventional, the electrical power distribution network 16 from the central utility company generating site typically carries 240 VAC at a residential or commercial level. A single-phase, three-wire power distribution network 16 is shown in FIGS. 1, 5 and 6 with three wires connected to the electrical power distribution network 16 at each utility customer site 18, as shown generally by reference number 132. Each line 134 and 136 carries 120 VACRMS with respect to neutral or ground wire 138 ±30% at 60 Hz. The customer conductors 132 are connected through the appropriate line contacts and terminals in the socket 30 and the socket adapter 40 to the power supply 122 of the automatic meter reader circuitry 120. The general function of the power supply 122 is to provide regulated, low level DC power at the preferred ±DC levels required by the electronic components used in the automatic meter reader circuit 120.

The power supply 122 includes an electromagnetic interference filter 140 formed of common mode inductors 142 and 143, noise capacitors denoted generally by reference numbers 144, 145 and 146, metal oxide varistors V2 and V3, and de-coupling capacitors 147 and 148. A rectifier/filter circuit 149 is connected to the filter 140. The rectifier/filter circuit 149 includes a full-wave, diode bridge rectifier 150, voltage doubler capacitors 151 and 152 and a filter capacitor 153, which are connected as shown in FIG. 6. The rectifier/filter circuit 148 and the de-coupler capacitors 147 and 148 of the filter circuit 140 are connected to a flyback converter circuit 154 which converts the output of the diode bridge rectifier 150 to a precise +5 VDC power output, labelled "VCC". The flyback converter circuit 154 is conventionally constructed and includes a flyback transformer 155 and a power switching regulator 156, Model No. PWR-SMP210BN1 sold by Power Integration Company. Various capacitors, resistors and diodes are interconnected in a conventional manner in the flyback converter circuit 154 to provide the desired output voltage.

As also shown in FIG. 6, the power supply 122 includes a boost circuit 160 for boosting the +5 VDC output from the flyback converter 154 to the +12 VDC for use with the various operational amplifiers employed in the automatic meter reader circuit 120. The boost circuit 160 includes boost inductors 162 and 164 as well as a boost regulator controller 166, such as a boost regulator controller Model No. MAX743EPE made by Maxim.

Figure 7:
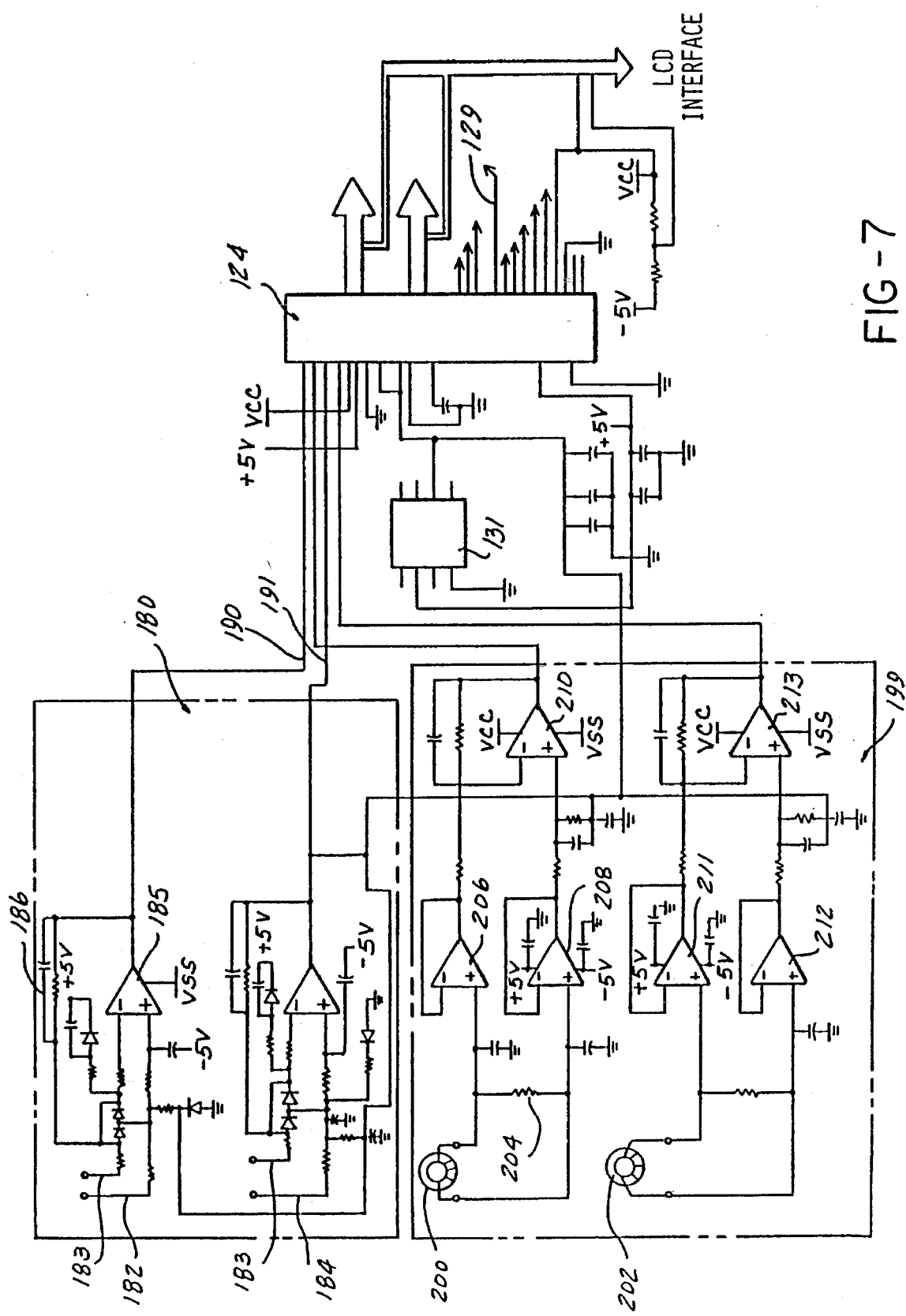
FIG. 7 is a detailed schematic diagram of the voltage and current sensing, and the analog to digital signal conversion circuits shown in FIG. 5.

The AMR circuit 120 also includes a voltage sensing network denoted in general by reference number 180 in FIG. 7. The voltage sensing network receives 120 VAC RMS 60 Hz input from the utility lead lines 132. One set of voltage inputs including voltage lead line connections 182 and 183 are between one lead line and neutral; while the other pair of inputs 184 and 183 is between the other lead line conductor and neutral. The voltage lead connections are provided by means of a jumper tab 193 mounted on each electrical contact or jaw terminal in the socket adapter 40. A clip 192 is releasably engageable with the jumper tab 193 and carries one of the voltage lead line connections 182 or 184 thereon. The voltage lead connections 182 and 183 are input to a differential amplifier 185 which has a gain of 1/100 set by resistors 186 and 187. The output of the differential amplifier 185 is input to an A/D converter 124. The other line connections 183 and 184 are input to a similar combination of differential amplifiers thereby resulting in two separate voltage inputs as shown by reference numbers 190 and 191 in FIG. 7 which are connected to inputs of the A/D converter 124. The differential amplifier 185 and the corresponding amplifier for the other lead line conductors provide an instantaneous voltage corresponding to the lead line voltage present on the conductors 182, 183 and 184 which is within the input range of the A/D converter 124. It should be understood that the input voltages supplied to the A/D converter 124 are instantaneous voltages.

The current sensing network of the AMR circuit 120 includes first and second current transformers 200 and 202, respectively, as shown in FIGS. 4, 5 and 15. The current transformers 200 and 202 include a high permeability toroid which is disposed around each of the customer line contacts 182 and 184, respectively, in the socket adapter 40.

The current transformers 200 and 202 are precision, temperature stable transformers which provide a ±10 volt output voltage signal in proportion to the instantaneous current flowing through the line conductors 134 and 136. In a physical mounting position, the current transformers 200 and 202 are disposed in the recess formed in the base 42 of the socket adapter 40 around the blade terminals of the socket adapter 40 extending through the recess between the shell 44 and the base 42 of the socket adapter 40. Each current transformer 200 and 202 may be eccentrically or concentrically disposed about the respective blade terminal. Further, the electrical conductive coil of each current transformer 200 and 202 is covered by a protective insulating coating, with the conductive coil leads or outputs extending into the housing 121.

In a preferred embodiment, each of the toroids forming the current transformers 200 and 202 is fixedly connected to opposite sides of the housing 121, preferably adjacent one end thereof, as shown in FIGS. 4 and 15. The toroids 201 of each current transformer are preferably disposed substantially in line with the back wall of the housing 121 so as to be disposed between the bottom wall 90 of the shell 44 and the back wall of the base. The central aperture in each toroid 201 is sized to be disposed about the jaw terminals mounted in the socket adapter and extending through the base 70 and the shell 44.

The outputs from the current transformer 200 are input to a conditioning circuit which adjusts the burden voltage between −10 volts to +10 volts by means of a burden resistor 204 shown in FIG. 7. The outputs of the current transformer 200 are each supplied to a separate amplifier 206 and 208, the outputs of which are respectively supplied as inputs to a differential amplifier 210. The output of the differential amplifier 210 which represents the scaled instantaneous current in the line conductor 134 is supplied as an input to the A/D converter 124 as shown in FIG. 7.

A similar signal conditioning circuit is provided for the current transformer 202. The outputs from the current transformer 202 are supplied to separate differential amplifiers 211 and 212, the outputs of which are connected as inputs to a differential amplifier 213. The output of the differential amplifier 213 is also supplied as a separate input to the A/D converter 124.

The outputs of the voltage and current sense circuits are input to the A/D converter 124. In a preferred embodiment, the A/D converter 124 is a twelve-bit +/−, self-calibrating, A/D converter, such as an A/D converter, Model No. LM12458C1V, sold by National Semiconductor Corporation. Clock input signals to the A/D converter are selected to provide a 64 per line cycle sample rate. In this manner, each of the voltage and current input signals supplied from the voltage sensing network 180 and the current sensing network 199 are sampled 64 times per cycle.

Figure 8B:
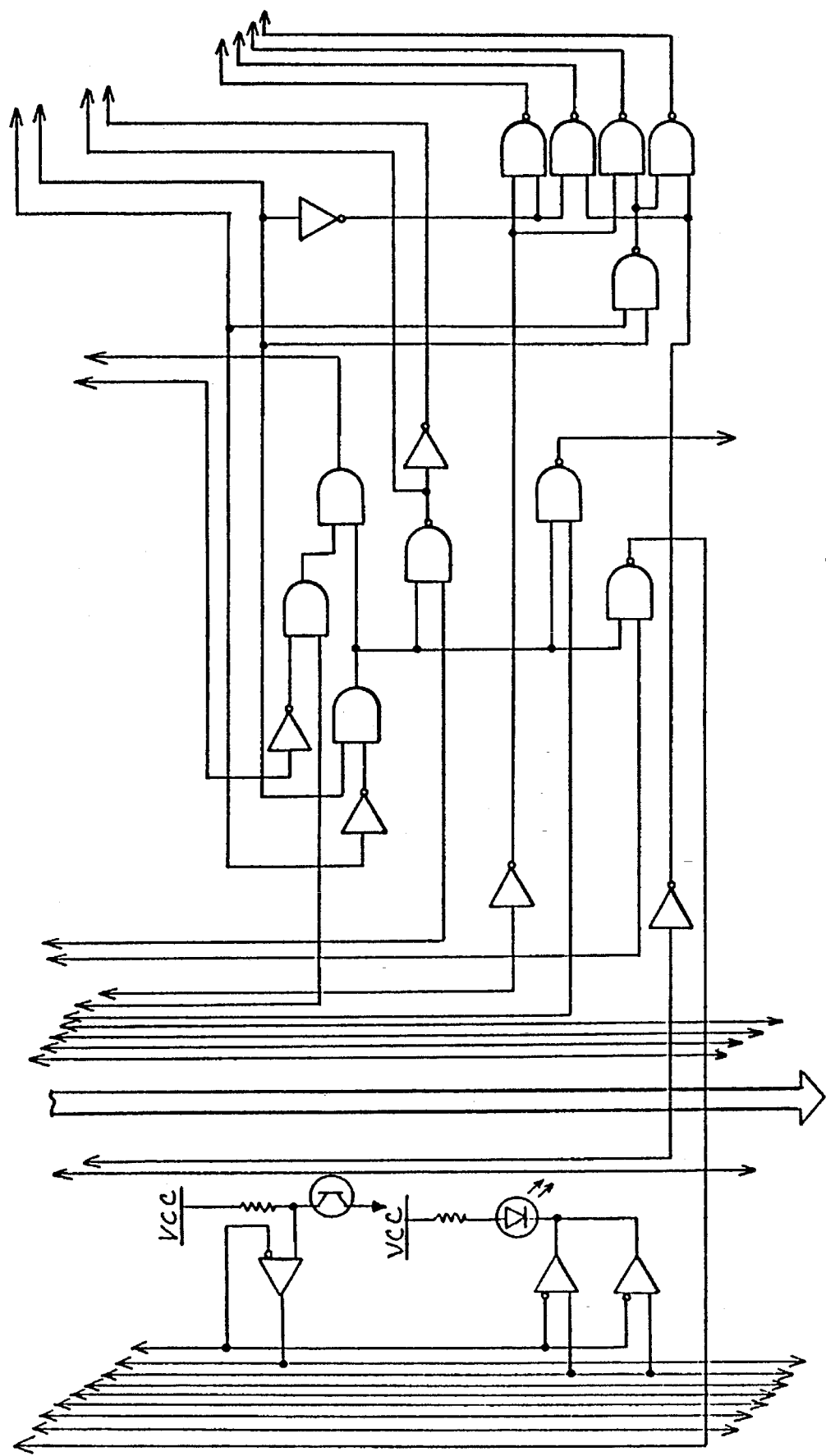

The clock input signals are generated by a clock signal 125 from a microcontroller 220, described hereafter, which is input to a J-K flip flop 127; FIG. 8A. The Q output 129 of the flip flop 127 is connected to the clock input of the A/D converter 124 to provide the desired sample rate.

The A/D converter 124 includes internal sample and hold circuits to store continuous voltage and current signal representations before transmitting such instantaneous voltage and current representations to other portions of the AMR circuitry 120, as described hereafter.

A 2.5 v voltage reference circuit, such as voltage reference circuit Model No. LT1029A CN8-2.5 sold by Linear Technologies, provides a voltage reference signal to the A/D converter 124 as shown in FIG. 7.

The outputs from the A/D converter 124 are connected to a central processing unit 126. The central processing unit 126, in a preferred embodiment which will be described hereafter by way of example only, is a 16 bit microcontroller, Model No. HPC36004V20, sold by National Semiconductor Corporation. This microcontroller is a 16 bit microcontroller which executes a control program stored in the memory 128, as described hereafter, to control the operation of the AMR circuit 120.

The microcontroller 220 also drives a display means 222, such as a liquid crystal display, for displaying, for example, the total kilowatt hours and KVA of power usage and instantaneous voltage, current and power factor values. Such a display 222 can be mounted, for example, at a suitable location on the socket 30, for example, for easy visibility. The display 222, in a preferred embodiment, contains 16 characters including nine decimal digits divided into six significant digits and three decimal digits.

As shown in FIGS. 13 and 14, the display 222 can optionally be mounted in a separate cover 223 which includes a circular front wall and an annular side wall or flange 225. The display 222 is mounted in the cover 223 and has a suitable electrical connector 221 extending therefrom for connection to the AMR circuitry in the socket adapter when the cover 223 is mounted on the socket adapter 40. A resilient protective material layer 227 is mounted interiorly on the back side of the cover 223 to protect the display 222. The cover 223 is mounted on the socket adapter 40 in place of the watthour meter 34 and is fixedly attached thereto by means of a conventional sealing ring in the same manner as the sealing ring 68 used to attach the watthour meter 34 to the socket adapter 40. The display 222 will sequence between five different data values, including accumulated KWH and KVA and instantaneous voltage, current and power factor.

Figure 8C:
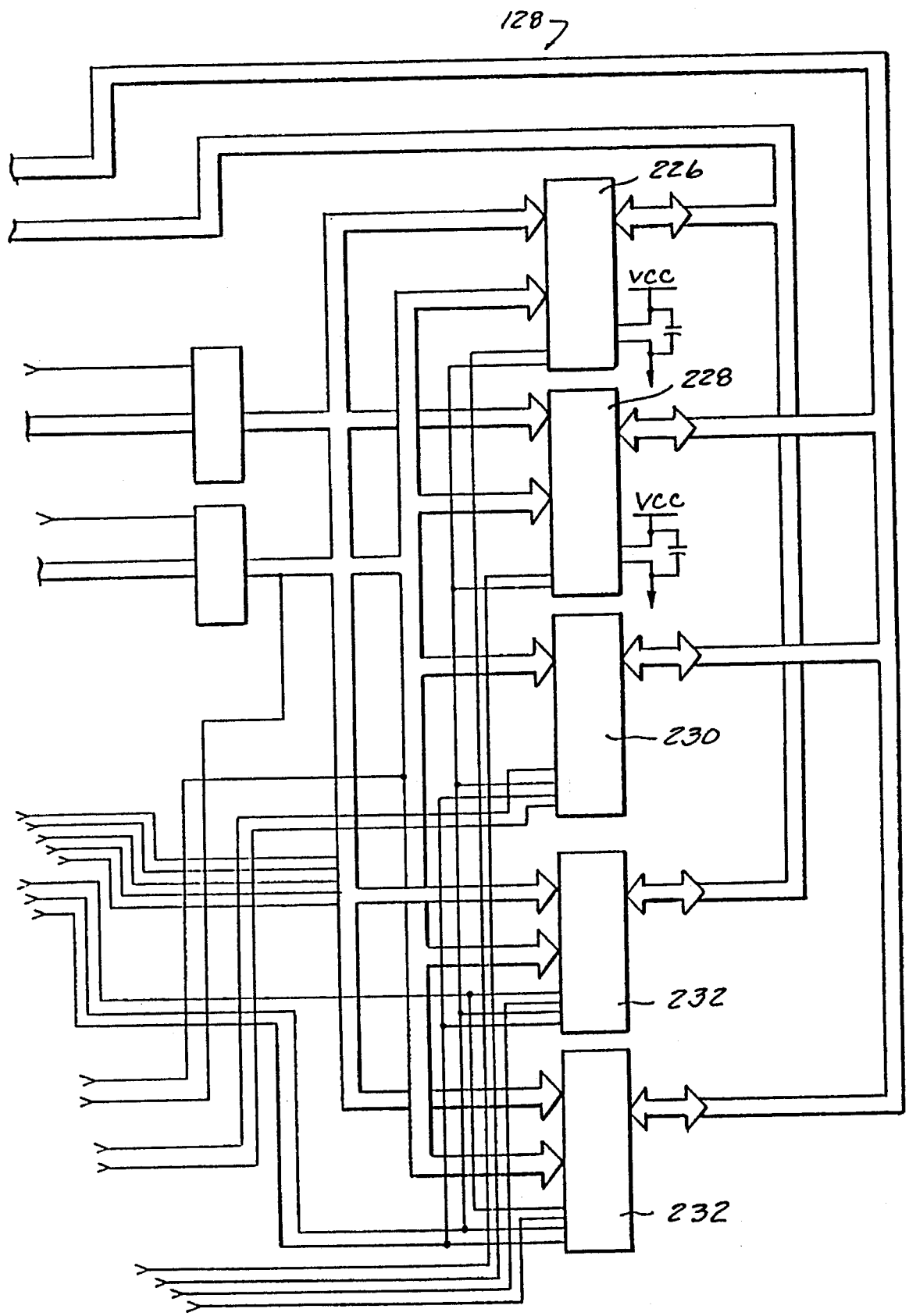

The memory 128, as shown in FIG. 8C, includes a plurality of separate memory sections. The first memory section includes, by way of example only, two 32K×8 bit EPROM memories 226 and 228. Two eight bit address busses 231A and 231B, FIGS. 8A and 8C, are output from the microcontroller 220 and pass through octal latches 238 to the address lines of the memories 226 and 228. Data buses 235A and 235B are also connected between the memories 226 and 228 and the microcontroller 220. The memory 128 also includes a non-volatile 8K×8 bit clock RAM memory 230. The memory 230 acts as a timekeeping RAM clock. The memory 230 is provided with time information via an address bus from the microcontroller 220 after a power outage. The memory 230 stores the date and time of any and all power outages and outputs such power outage information via an output data bus which is connected between the memory 230 and the microcontroller 220. Finally, two 32K×8 EEPROM memories 232 are provided as data storage for optional load survey information. The memories 232 are connected by the address buses 231A and 231B and the memory data buses 235A and 235B to the microcontroller 220 as shown in FIG. 8C. The memories 232 are available to store load versus time information in the form of KVAR and KWH.

Figure 9:
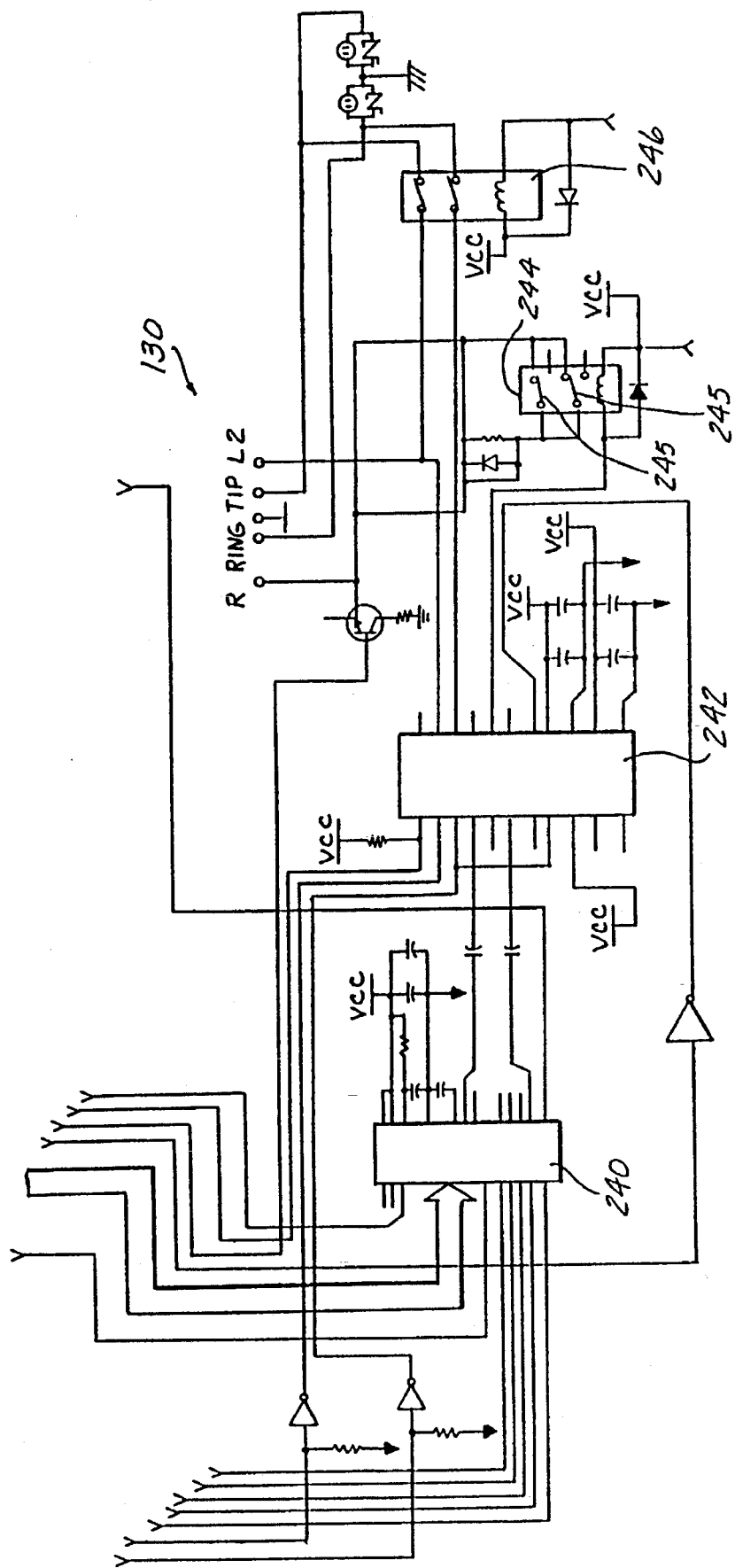
FIG. 9 is a detailed schematic diagram of the telephone modem shown generally in FIG. 5.

As shown in FIG. 5, and in greater detail in FIG. 9, the modem 130 receives inputs from the microcontroller 220 as well as from the A/D converter 124 and provides suitable data communication connections and data flow over the telephone conductors 22 connected thereto. By way of example only, the modem 130 is a two-way, 300 baud, reverse handshake modem, such as a single chip Bell 103 standard compatible modem data pump, which may be used on a call-in or called basis as described hereafter.

The modem 130 includes a single chip modem circuit 240, Model No. SS173K312, sold by Silicon Systems, which receives data signals from the microcontroller 220 and controls the serial transfer of data to and from the microcontroller 220. The transmit and receive pins of the modem circuit 240 are connected to corresponding pins on a direct access circuit 242, Model No. PN73M9001, sold by Silicon Systems, Inc. which is connected to a relay 244 having two form contacts 245. The contacts 245 are connected to the coil of a relay 246. It should be noted that the RING and TIP input connections from the telephone network at the remote site are connected to both the circuit 242 and the relay 246.

As shown in FIG. 5, the anti-tampering switch 250 is mounted within the housing 121 to detect any unauthorized movement of the housing 121 and the surrounding socket adapter 40 as would accompany an unauthorized attempt to remove the socket adapter 40 and/or watthour meter 34 from the socket housing 30 or to insert wires through the socket adapter 40 into the socket housing 30. The switch 250 may be any suitable electrical switch which senses motion. For example, a reed-type mercury switch may be employed to detect any movement of the AMR after it has been installed in its use location by an authorized person.

The form C relay 252 is mounted in a separate housing 253 which is attachable to the housing 121 as shown in FIG. 3. An opto signal transmitter 255 mounted in a window in the housing 121 is activated by the microcontroller 220 and transmits a light signal to an opto receiver 255 mounted in a window in the C relay housing 253. The opto receiver 255 activates the C relay 252 to switch the state of the contact 257 of the C relay 252. The double throw, single pole contact 257 may be employed for any suitable function, such as demand management load control devices, i.e., a disconnect switch or other external device to shed loads, terminate electrical service, etc. In the preferred embodiment, the relay 252 may be selectively activated so as to energize the contacts once during each 24 hour period.

The opto-coupler 254 is also mounted in the socket adapter and connected to the microcontroller 220. The opto-coupler 254 is responsive to light signals, such as infrared light signals, and functions to covert such light signals to electronic data signals. The coupler 254 includes a receiving unit 256 which is mounted in an aperture 255 in the shell 44 of the socket adapter 40 and extends outward from the shell 44. A cover, not shown, may be provided to sealingly enclose the receiving unit 256 of the optocoupler 254 when the opto-coupler 254 is not in use. The optocoupler 254 may be employed to receive light signals from transmitters on adjacent water and gas meters, for example, and to convert such light signals to electrical data signals which can be relayed by the microcontroller 220 via the telephone modem 22 to the central utility site 10 for subsequent data processing. In addition, the opto-coupler 254 may be employed to set AMR parameters, such as voltage levels, clock signals, time windows, etc., directly at the remote customer site.

Remote AMR Control Program

Figure 10:
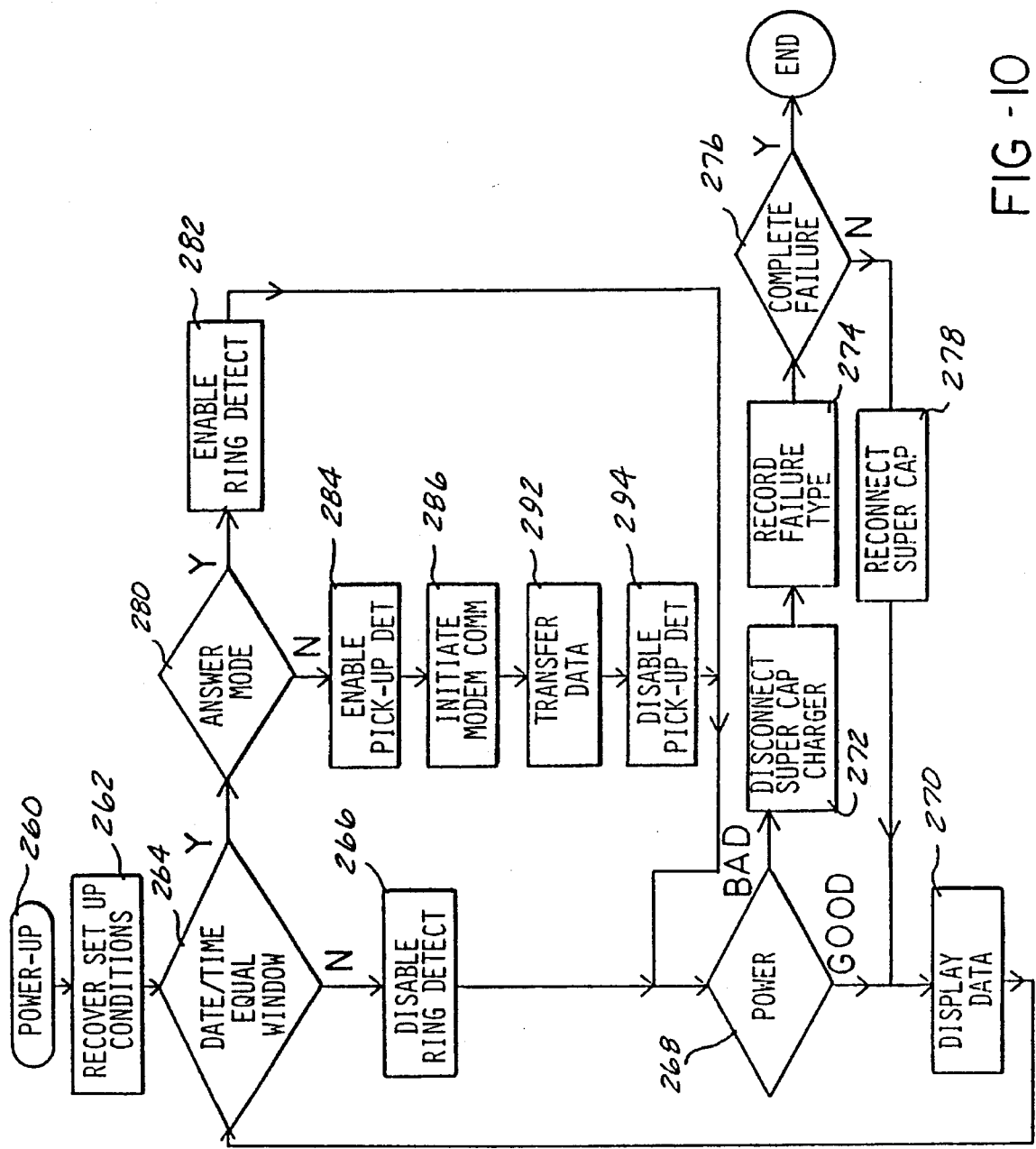
FIGS. 10 and 11 are flow diagrams of the software control program controlling the operation of the remote automatic meter reading apparatus.
Figure 11:
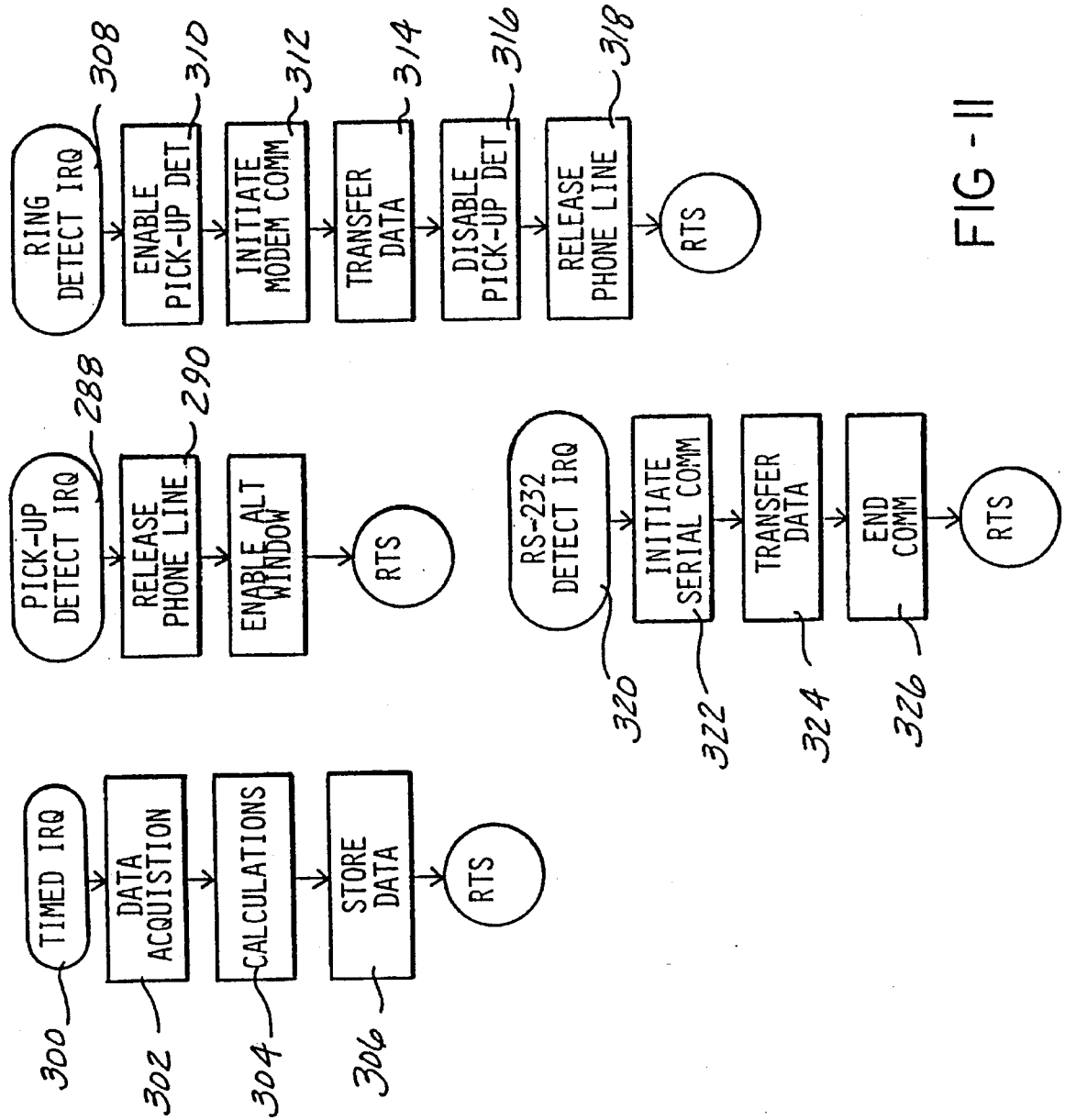

FIGS. 10 and 11 depict the control program stored in non-volatile memory 226 and 228 which controls the operation of each remote AMR 18. After a power up, step 260 in FIG. 10, the control program recovers the set up conditions for each particular AMR 18. Such set up condition recovery, step 262, occurs after the initial power up and after the power up occurring after each power loss. The reset conditions are used to reset the microcontroller 220 and provide data concerning the primary and alternate window dates and times of the particular AMR.

Next, in step 264, the current date/time stored in the RAM clock memory 230 is compared with the primary window date (day) and time (hour and minute) stored in the set up conditions for the particular AMR 18. If the current date/time does not equal the primary or alternate date/time window, step 266 is executed which disables the telephone ring detect circuit. Next, the power connections are checked in step 268. If the power connections are good, the data is displayed in step 270 before the control program returns to the data/time equal primary window step 264.

In step 268, the power check step tests the L1 and L2 conductors for the presence of voltage on both conductors, the proper voltage, and voltage within or outside of the specified voltage range. In the event that the power connections are determined to be bad in step 268, the super cap charger is disconnected in step 272. This disconnects the charging circuit to the real time clock RAM 230. The type of failure is recorded in step 274 and the type of failure, i.e., whether complete or other, is checked in step 276. If the failure is a complete failure, the control program ceases execution until the next power up occurs. If a non-complete failure occurs, the super cap charging circuit is reconnected in step 278, the data displayed in step 270 and program control returns to step 264.

The control program stored in the memory 226 and 228 is devised to store data relating to a plurality of separate power outages. For example only, data pertaining to ten different power outages may be stored in the memory 226 and 228 via step 224 in the control program described above. Such data includes the number of power outage currents as well as the month, day, hour, minute of the occurrence of the power outage and the duration in minutes and hours of each power outage. This data is transferred from the AMR to the central computer during normal data reporting, as described hereafter.

If the date/time check in step 264 determines that the current date/time equals the primary or alternate programmed window, the AMR is moved into an answer mode in step 280. If the AMR is programmed to receive data, thereby indicating a proper answer mode condition, the control program causes the AMR to enable the telephone ring detect circuit in step 282 before looping to step 268. If an answer mode is not entered in step 280, the pickup detection circuit is enabled in step 284 and telephone modem communication is then initiated in step 286. The pick-up detection circuit will detect the occurrence of a customer picking up the telephone during a data transfer. When this occurs, a subroutine labelled pick-up detect interrupt request (IRQ), step 288 in FIG. 11, is executed. In this subroutine, which occurs only when the pick-up detection circuit has been enabled and a customer picks up the telephone during a data transfer to the central utility site 10, the AMR will release its connection to the customer telephone line in step 290 and enable the alternate window for later data transfer. The day, hour and minute of the alternate or secondary windrow is stored in the memory 226 and 228. This information is initially programmed into the memory 226 and 228 by the central computer 12 during initialization of the remote AMR. Control then returns to the primary program loop described above.

After the modem communication has been initiated in step 286, data will be transferred from the remote AMR 18 to the central utility site 10 in step 292, FIG. 10. Finally, the pick-up detection circuit is disabled in step 294 to complete this program loop.

Various interrupt subroutines are shown in FIG. 11. The timed interrupt request (timed IRQ) 300 is a non-masked interrupt and occurs at all times and with a primary status over all other interrupt requests. Timed IRQ, step 300, occurs every 260.4 microseconds based on 64 samples per cycle. When this interrupt request occurs, data acquisition starts in step 302 in which the A/D converter values are read into the microcontroller 220, the calculations, described hereafter, are performed on such data in step 304 and the results stored in memory 226 and 228 in step 306. At the completion of the memory storage step 306, control returns to the primary program loop described above and shown in FIG. 10.

At the periodic sample rate of 64 samples per cycle, or once every 260.4 microseconds, the digital values corresponding to the instantaneous voltage and current will be input to the micorcontroller 220, as described above. The microcontroller 220 then executes a calculation subroutine to determine the kilowatt hours of electrical power consumed since the last sample. According to the equation:

$$KWH = K \cdot Vrms \cdot Irms \cdot (T2-T1), \text{ where}$$

K is a calibration constant
T1 is the preceding sample time
T2 is the current sample time The control program also calculates the power factor, KVAR, according to known electrical power factor and VAR equations.

Furthermore, the instantaneous current and voltage data at the sample rate is input to the microcontroller 220 for each separate line L1 and L2 or phase of electrical power. Separate power, instantaneous voltage and current and power factor data is stored in the memory 226 and 228 by the microcontroller 220 for each phase or line at each sample period.

When a ring detect interrupt request (IRQ) occurs in step 308, the control program will enable the pick-up detect circuit in step 310 and initiate modem communication in step 312 via a conventional handshake protocol. Data stored in the memories 226 and 228 is then transferred in step 314 via the telephone modem 130 and telephone line conductors to the central utility site 10. In step, 316, the pick-up detection circuit is disabled and the telephone line is then released in step 318.

Finally, a subroutine labelled RS-232 detect IRQ, step 320, detects a request for serial data communication. When this interrupt occurs, serial communication is initiated in step 322 and the data is transferred in step 324 via optocoupler 254. The end of communication is detected in step 326 before control returns to the primary control loop.

It should also be noted that the RS-232 detect interrupt request and the ring detect interrupt request signals, steps 308 and 320, are mutually exclusive such that when the ring detect is enabled, the RS-232 interrupt request is disabled and vice versa. Similarly, when the timed IRQ subroutine, step 300, interrupt request is received, the RS-232 interrupt detect is disabled. At the completion of the timed IRQ subroutine, the RS-232 detect interrupt request is re-enabled and, if previously interrupted, will complete its serial data communication.

In summary, there has been disclosed a unique remote automatic meter reading apparatus which senses, calculates and stores electrical power consumption values at each of a plurality of electrical utility customer sites and communicates such power consumption values at predetermined times to a centrally located utility site. The apparatus of the present invention also includes a unique socket adapter mountable in a watthour meter socket which contains the remote AMR circuitry for each remote site in a compact package thereby eliminating the need for extra enclosures at each remote customer site.

What is claimed is:

1. A remote metering system, including a central computer and a plurality of digital meters installed at locations remote from said central computer, said central computer including communicating means for remotely communicating with each of said plurality of digital meters, each of said plurality of digital meters including:

a current sensing circuit and voltage sensing circuit for sensing current and voltage, respectively, of electricity passing through said meter and producing current and voltage signals indicative of a magnitude sensed current and voltage;

an analog-to-digital converter, responsive to said current and voltage signals, for producing a plurality of digital signals at predetermined time intervals indicative of said sensed current and voltage;

processing means, responsive to said plurality of digital signals, for calculating an amount of electrical power passing through said meter and producing consumption signals indicative of consumed power for each predetermined time interval;

memory means, responsive to said processing means, for storing data indicative of said consumed power; and power outage detection means, responsive to said voltage sensing circuit, for detecting a power outage condition and storing outage data indicative of said power outage condition in said memory means, wherein said power outage detection means includes outage type determination means for determining if said power outage condition is one of a first type power outage condition and a second type power outage condition, wherein said power outage detection means includes means for disabling operation of said meter responsive to a determination that said power outage condition is a first type power outage condition.

2. A remote metering system in accordance with claim 1, wherein said memory means includes a plurality of storage locations for storing said outage data indicative of a plurality of power outage conditions.

3. A remote metering system according to claim 2, wherein said outage data includes data indicative of at least one of a type of power outage condition, a total number of power outage conditions over a predetermined period of time, time data indicative of when said power outage condition occurred, and duration data indicative of a length of time for each detected power outage condition.

4. A remote metering system according to claim 1, each of said plurality of digital meters further including:

clock means for producing clock signals indicative of date and time;

meter communication means, responsive to said remote communication means, for communicating with said central computer and transmitting said stored data to said central computer; and control means, responsive to said clock means, for selectively enabling said meter communication means to communicate with said remote communication means during a first predetermined time period, and disabling said meter communication means outside of said first predetermined time period.

5. A remote metering system in accordance with claim 4, wherein said control means includes interrupt detect means for detecting an interruption in communication between said meter communication means and said remote communication means, said control means being responsive to said detected interruption for selectively enabling said meter communication means to communicate with said remote communication means during a second predetermined time period, and disabling said meter communication means outside of said second time period.

6. A remote metering system in accordance with claim 5, where said meter communication means comprises a modem connected to a telephone line.

7. A remote metering system in accordance with claim 6, wherein said data indicative of consumed power includes time of use data indicative of power consumed during a plurality of predetermined time intervals.

8. A remote metering system in accordance with claim 6, wherein said interrupt detect means comprises a pick-up detection circuit for detecting a picking up of a telephone connected with said telephone line.

9. A remote metering system in accordance with claim 6, wherein each of said digital meters further includes ring detection means for detecting a telephone call coming in to said digital meter, said ring detection means being responsive to said control means for selectively enabling and disabling said ring detection means in accordance with said first and second predetermined time periods.

10. A remote metering system in accordance with claim 8, wherein said memory means stores first time window data for determining said first predetermined time period, said control means including comparing means for comparing said clock signals with said first time window data to control enabling and disabling of communication between said remote communication means and said meter communication means.

11. A remote metering system in accordance with claim 10, wherein said memory means stores second time window data for determining said second predetermined time period, said comparing means being responsive to said detected interruption for comparing said clock signals with said second time window data.

12. A remote metering system in accordance with claim 11, wherein each of said digital meters further includes ring detection means for detecting a telephone call coming in to said digital meter, said ring detection means being responsive to said comparing means for selectively enabling and disabling said ring detection means in accordance with said first and second time window data.

* * * * *